US012796202B2

(12) United States Patent
Kinjo et al.

(10) Patent No.: US 12,796,202 B2
(45) Date of Patent: Nov. 10, 2026

(54) DISPLAY DEVICE AND MANUFACTURING METHOD THEREOF

(71) Applicant: Japan Display Inc., Tokyo (JP)

(72) Inventors: Hiroumi Kinjo, Tokyo (JP); Masumi Nishimura, Tokyo (JP); Hayata Aoki, Tokyo (JP)

(73) Assignee: Japan Display Inc., Tokyo (JP)

( * ) Notice: Subject to any disclaimer, the term of this patent is extended or adjusted under 35 U.S.C. 154(b) by 333 days.

(21) Appl. No.: 18/647,400

(22) Filed: Apr. 26, 2024

(65) Prior Publication Data

US 2024/0274648 A1 Aug. 15, 2024

Related U.S. Application Data

(63) Continuation of application No. PCT/JP2022/031913, filed on Aug. 24, 2022.

(30) Foreign Application Priority Data

Oct. 29, 2021 (JP) ................................ 2021-177228

(51) Int. Cl.
*H10H 29/32* (2025.01)
*H10H 29/01* (2025.01)

(52) U.S. Cl.
CPC .......... *H10H 29/012* (2025.01); *H10H 29/32* (2025.01)

(58) Field of Classification Search
CPC ............................ H10H 29/012; H10H 29/32
See application file for complete search history.

(56) References Cited

U.S. PATENT DOCUMENTS

| | | | | |
|---|---|---|---|---|
| 8,791,474 | B1 | 7/2014 | Bibl et al. | |
| 11,251,223 | B2 * | 2/2022 | Long | H10D 86/421 |
| 11,362,247 | B2 * | 6/2022 | Kong | H10H 20/8312 |
| 11,527,642 | B2 * | 12/2022 | Park | H10D 30/015 |
| 12,176,377 | B2 * | 12/2024 | Chen | H10H 29/10 |
| 2020/0075664 | A1 | 3/2020 | Azize et al. | |

* cited by examiner

*Primary Examiner* — Daniel Luke
(74) *Attorney, Agent, or Firm* — Maier & Maier, PLLC

(57) ABSTRACT

A display device includes a transistor on a first region of an amorphous substrate and an LED on a second region different from the first region of the amorphous substrate. Each of the transistor and the LED includes a conductive alignment layer, a first semiconductor layer over the conductive alignment layer, and a second semiconductor layer over the first semiconductor layer. The conductive alignment layer, the first semiconductor layer, and the second semiconductor layer of the transistor are the same layer as the conductive alignment layer, the first semiconductor layer, and the second semiconductor layer of the LED, respectively. In the transistor, the first semiconductor layer is in contact with the second semiconductor layer. In the LED, a light emitting layer is provided between the first semiconductor layer and the second semiconductor layer.

9 Claims, 23 Drawing Sheets

20

20A

30

30C

40

DISPLAY DEVICE AND MANUFACTURING METHOD THEREOF

CROSS-REFERENCE TO RELATED APPLICATIONS

This application is a Continuation of International Patent Application No. PCT/JP2022/031913, filed on Aug. 24, 2022, which claims the benefit of priority to Japanese Patent Application No. 2021-177228, filed on Oct. 29, 2021, the entire contents of which are incorporated herein by reference.

FIELD

An embodiment of the present invention relates to a display device including a transistor and a light emitting diode (LED) using a compound semiconductor.

BACKGROUND

Gallium nitride (GaN), which is one type of compound semiconductor, is a direct bandgap semiconductor with a large bandgap. Gallium nitride has already been in practical use for a light emitting diode (LED). Further, Gallium nitride has the characteristics of a high saturated electron mobility and a high breakdown voltage. In recent years, a transistor for a high-frequency power device has been developed by utilizing the characteristics of gallium nitride. A gallium nitride film for an LED or a transistor is generally formed on a sapphire substrate at a high temperature of 800 degrees to 1000 degrees using MOCVD (Metal Organic Chemical Vapor Deposition) or HVPE (Hydride Vapor Phase Epitaxy).

In recent years, the development of a so-called micro LED display device or a mini-LED display device in which minute micro LEDs are mounted in pixels on a circuit substrate is proceeding as a next-generation display device. The micro LED display device or the mini LED display device has high efficiency, high brightness and high reliability. Such a micro LED display device or a mini-LED display device is manufactured by transferring an LED chip to a backplane on which a transistor is formed using an oxide semiconductor or low-temperature polysilicon (for example, see U.S. Pat. No. 8,791,474). Further, a method for forming a transistor and an LED including gallium nitride on the same substrate is also being considered (for example, see U.S. Patent Application Publication No. 2020/0075664).

SUMMARY

A display device according to an embodiment of the present invention includes a transistor on a first region of an amorphous substrate and an LED on a second region different from the first region of the amorphous substrate. Each of the transistor and the LED includes a conductive alignment layer, a first semiconductor layer over the conductive alignment layer, and a second semiconductor layer over the first semiconductor layer. The conductive alignment layer, the first semiconductor layer, and the second semiconductor layer of the transistor are the same layer as the conductive alignment layer, the first semiconductor layer, and the second semiconductor layer of the LED, respectively. In the transistor, the first semiconductor layer is in contact with the second semiconductor layer. In the LED, a light emitting layer is provided between the first semiconductor layer and the second semiconductor layer.

Further, a method for manufacturing a display device according to an embodiment of the present invention, includes the steps of depositing a conductive alignment film on an amorphous substrate, depositing a first semiconductor film on the conductive alignment film, forming a gate electrode over a first region of the amorphous substrate, forming a light emitting film over a second region different from the first region of the amorphous substrate, depositing a second semiconductor film over the gate electrode and the light emitting film, and patterning the conductive alignment film, the first semiconductor film, and the second semiconductor film to form a transistor comprising the gate electrode over the first region and an LED comprising the light emitting film over the second region.

Furthermore, a method for manufacturing a display device according to an embodiment of the present invention, includes the steps of depositing a conductive alignment film on an amorphous substrate, the amorphous substrate including a first region and a second region different from the first region, patterning the conductive alignment film to form a conductive alignment layer on each of the first region and the second region, depositing a first semiconductor film on the conductive alignment layer, patterning the first semiconductor film to form a first semiconductor layer on the conductive alignment layer of each of the first region and the second region, forming a light emitting layer on the first semiconductor layer of the second region, depositing a second semiconductor film on the first semiconductor layer of the first region and the light emitting layer of the second region, patterning the second semiconductor film to form a second semiconductor layer on each of the first semiconductor layer of the first region and the light emitting layer of the second region, and forming a gate electrode over the second semiconductor layer of the second region.

DESCRIPTION OF EMBODIMENTS

Figure 1:
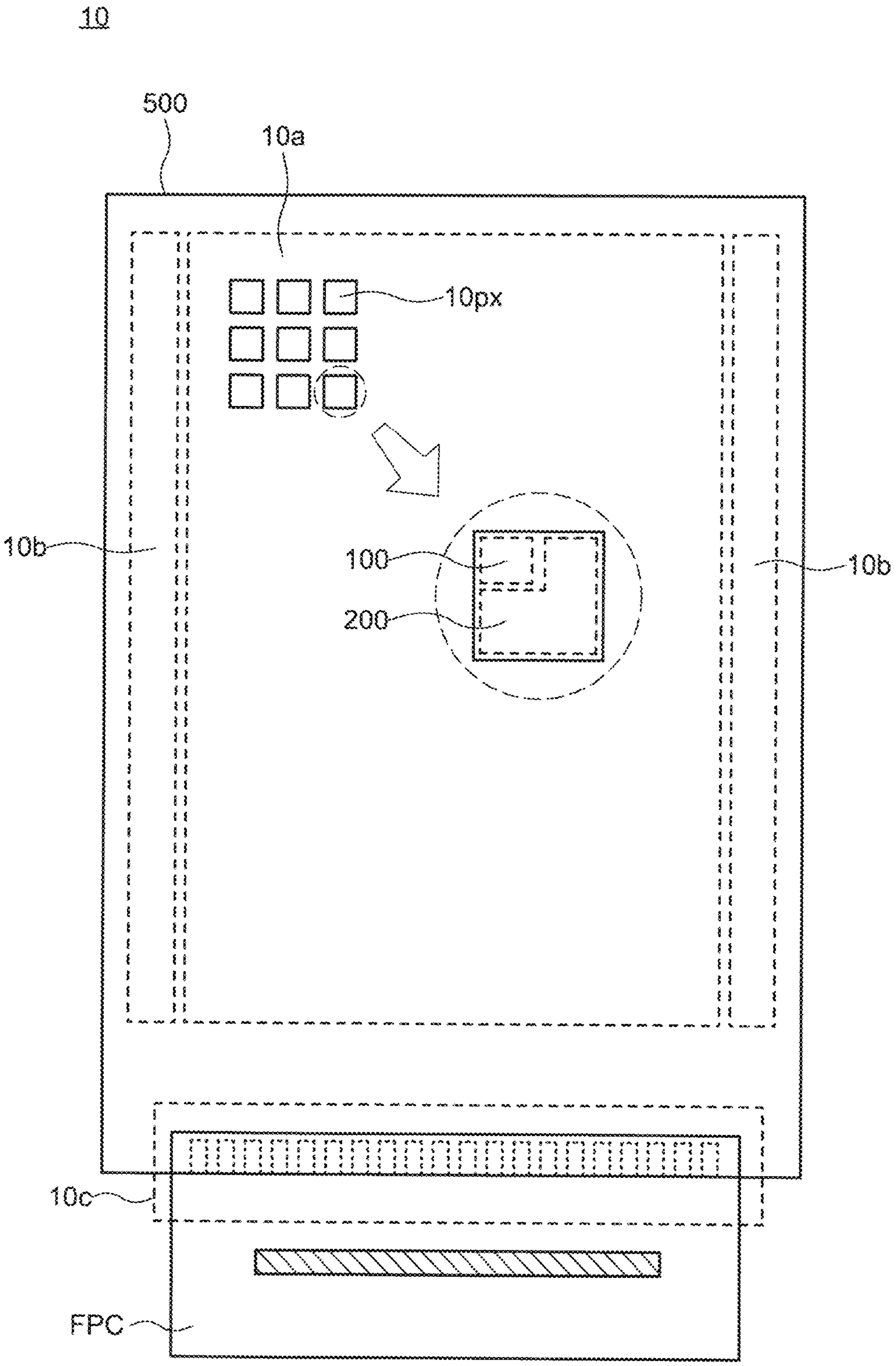
FIG. 1 is a schematic diagram showing an overview of a display device according to an embodiment of the present invention.

The method for manufacturing a micro LED display device by transferring LED chips has a high manufacturing cost, and it is difficult to manufacture the micro LED display device at low cost. On the other hand, if not only an LED but also a transistor using gallium nitride can be formed on a large-area substrate such as an amorphous glass substrate, the manufacturing cost can be reduced. However, as described above, since a gallium nitride film is formed on a sapphire substrate at a high temperature, it is difficult to form a gallium nitride film directly on an amorphous glass substrate.

In view of the above problems, an embodiment of the present invention can provide a display device including a transistor and an LED that are provided directly on an amorphous substrate.

Hereinafter, each of the embodiments of the present invention are described with reference to the drawings. Each of the embodiments is merely an example, and a person skilled in the art could easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

In the present specification, the expressions "α includes A, B or C", "α includes any of A, B and C", and "α includes one selected from the group consisting of A, B and C" do not exclude the case where α includes a plurality of combinations of A to C unless otherwise specified. Further, these expressions do not exclude the case where α includes other elements.

In the present specification, although the phrase "above" or "above direction" or "below" or "below direction" is used for convenience of explanation, in principle, the direction from a substrate toward a structure is referred to as "above" or "above direction" with reference to a substrate in which the structure is formed. Conversely, the direction from the structure to the substrate is referred to as "below" or "below direction". Therefore, in the expression of a structure over a substrate, one surface of the structure in the direction facing the substrate is the bottom surface of the structure and the other surface is the upper surface of the structure. In addition, the expression of a structure over a substrate only explains the vertical relationship between the substrate and the structure, and another member may be placed between the substrate and the structure. Furthermore, the terms "above" or "above direction" or "below" or "below direction" mean the order of stacked layers in the structure in which a plurality of layers are stacked, and may not be related to the position in which layers overlap in a plan view.

In the specification, terms such as "first", "second", or "third" attached to each configuration are convenient terms used to distinguish each configuration, and have no further meaning unless otherwise explained.

In the specification and the drawings, the same reference numerals may be used when multiple configurations are identical or similar in general, and reference numerals with a lower-case letter or an upper-case letter of the alphabet may be used when the multiple configurations are distinguished. Further, reference numerals with a hyphen and a natural number may be used when multiple portions of one configuration are distinguished.

The following embodiments can be combined with each other as long as there is no technical contradiction.

First Embodiment

A display device 10 according to an embodiment of the present invention is described with reference to FIGS. 1 to 3 and 4A to 4H.

[1. Overview of Display Device 10]

FIG. 1 is a schematic diagram showing an overview of the display device 10 according to an embodiment of the present invention. The display device 10 includes a display portion 10*a*, a drive circuit portion 10*b*, and a terminal portion 10*c* provided on an amorphous substrate 500. The drive circuit portion 10*b* is provided outside the display portion 10*a*, and can control the display portion 10*a*. Further, the terminal portion 10*c* is provided at an edge portion of the amorphous substrate 500, and can supply signals or power to the display device 10. The terminal portion 10*c* is connected to, for example, a flexible printed circuit board FPC. In addition, a driver IC or the like may be provided on the flexible printed circuit board FPC.

The display portion 10*a* includes a plurality of pixels 10*px* arranged in a matrix, and can display a still image or a moving image. Further, each of the plurality of pixels 10*px* includes a transistor formation region 100 and an LED formation region 200. A transistor and an LED are formed in the transistor formation region 100 and the LED formation region 200, respectively. In addition, a capacitor element may be formed in the transistor formation region 100.

Figure 2:
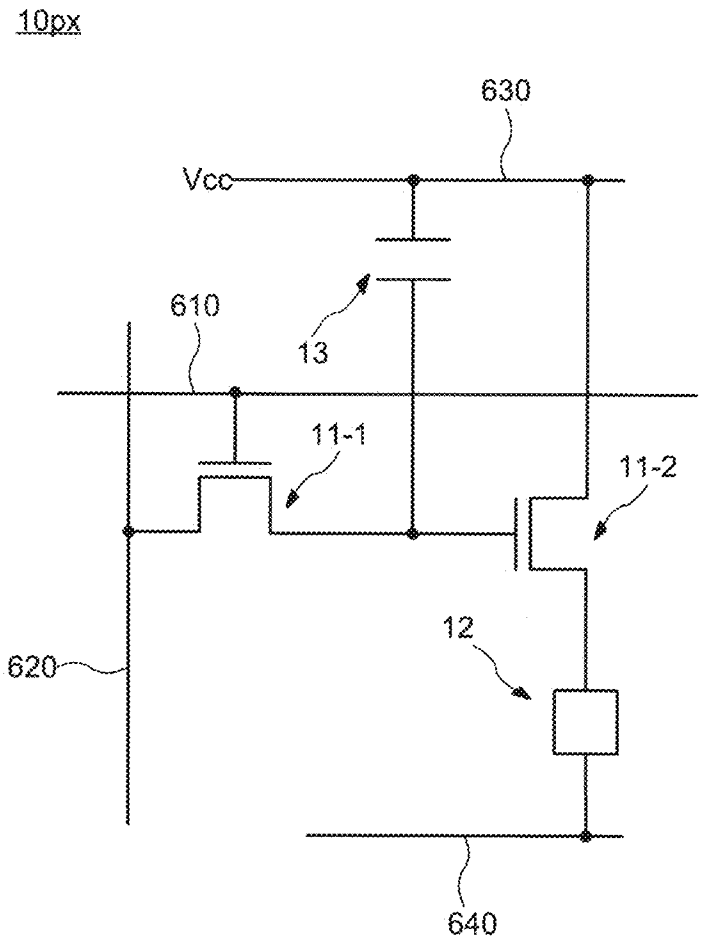
FIG. 2 is a circuit diagram showing a configuration of a pixel circuit in a pixel of a display device according to an embodiment of the present invention.

FIG. 2 is a circuit diagram showing a configuration of a pixel circuit of the pixel 10*px* of the display device 10 according to an embodiment of the present invention. The pixel 10*px* includes a first transistor 11-1, a second transistor 11-2, an LED 12, and a capacitor element 13.

The first transistor 11-1 can function as a selection transistor. That is, the conduction state of the first transistor 11-1 is controlled by a scanning line 610. A gate, a source, and a drain of the first transistor 11-1 are electrically connected to the scanning line 610, a signal line 620, and a gate of the second transistor 11-2, respectively.

The second transistor 11-2 can function as a drive transistor. That is, the second transistor 11-2 controls the emission brightness of the LED 12. The gate, a source, and a drain of the second transistor 11-2 are electrically connected to the source of the first transistor 11-1, a drive power line 630, and a cathode (n-type electrode) of the LED 12, respectively.

The cathode of the LED 12 is electrically connected to the drain electrode of the second transistor 11-2. Further, an anode of the LED 12 is electrically connected to a reference power line 640.

One electrode of the capacitor element 13 is electrically connected to the gate of the second transistor 11-2 and the drain of the first transistor 11-1. Further, the other electrode of the capacitor element 13 is electrically connected to the drive power line 630.

In the display device 10, the first transistor 11-1, the second transistor 11-2, and the capacitor element 13 are formed in the transistor formation region 100, and the LED 12 is formed in the LED formation region 200.

In addition, the configuration of the pixel circuit shown in FIG. 2 is one example, and the pixel circuit of the display device 10 is not limited thereto.

[2. Configuration of Transistor Formation Region 100 and LED Formation Region 200]

Figure 3:
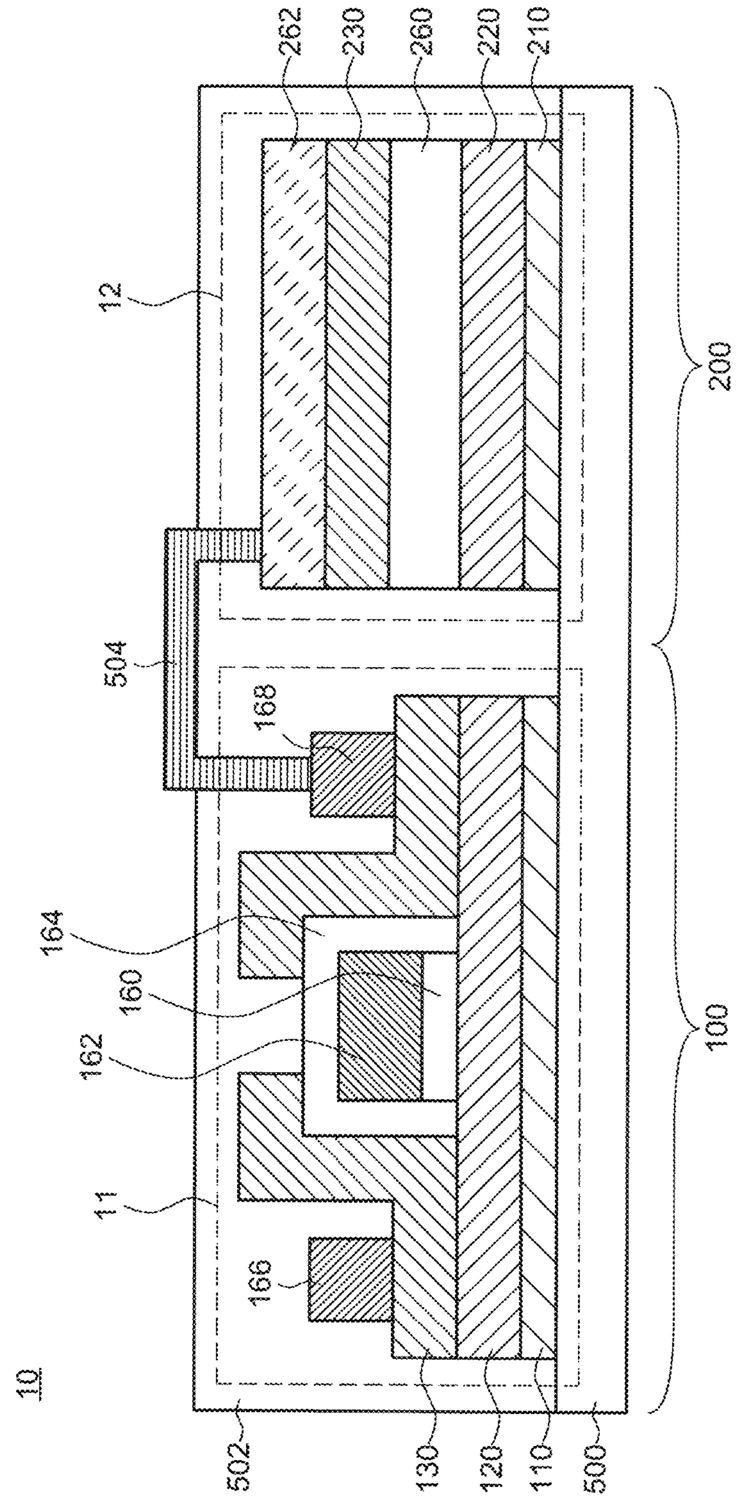
FIG. 3 is a schematic cross-sectional view showing configurations of a transistor formation region and an LED formation region of a display device according to an embodiment of the present invention.

FIG. 3 is a schematic cross-sectional view showing a configuration of the transistor formation region 100 and the LED formation region 200 of the display device 10 according to an embodiment of the present invention. Since a structure of the first transistor 11-1 is similar to that of the second transistor 11-2, only the second transistor 11-2 and the LED 12 are shown in FIG. 3, for convenience of explanation. In addition, hereinafter, the first transistor 11-1 and the second transistor 11-2 are not particularly distinguished, and the first transistor 11-1 or the second transistor 11-2 is described as a transistor 11.

The transistor 11 and the LED 12 are provided on an amorphous substrate 500. The amorphous substrate 500 is a support substrate for transistor 11 and LED 12. For example, the amorphous glass substrate can be used as the amorphous substrate 500. Further, in the display device 10, a resin substrate such as polyimide resin, acrylic resin, siloxane resin, or fluororesin, or a polycrystalline substrate such as polysilicon can be used instead of the amorphous substrate 500. Although not shown in the figures, a base layer may be provided on the amorphous substrate 500. The base layer can prevent impurities from the amorphous substrate 500 or impurities from the outside (e.g., moisture, sodium (Na), etc.) from diffusing. For example, a silicon nitride ($SiN_x$) film or the like can be used as the base layer. Further, a laminated film of a silicon oxide ($SiO_x$) film and a silicon nitride ($SiN_x$) film can also be used as the base layer.

The transistor 11 includes a first conductive alignment layer 110, a first p-type semiconductor layer 120, a first n-type semiconductor layer 130, a gate insulating layer 160, a gate electrode layer 162, an insulating layer 164, a source electrode layer 166, and a drain electrode layer 168. The LED 12 includes a second conductive alignment layer 210, a second p-type semiconductor layer 220, a second n-type semiconductor layer 230, a light emitting layer 260, and an n-type electrode layer 262. Although details are described later, the first conductive alignment layer 110 and the second conductive alignment layer 210 are the same layer formed by patterning a film that is deposited in the same process. Similarly, the first p-type semiconductor layer 120 and the second p-type semiconductor layer 220 are the same layer formed by patterning a film that is deposited in the same process and the first n-type semiconductor layer 130 and the second n-type semiconductor layer 230 are the same layer formed by patterning a film that is deposited in the same process.

In the transistor 11, the first conductive alignment layer 110 is provided on the amorphous substrate 500. The first p-type semiconductor layer 120 is provided on and in contact with the first conductive alignment layer 110. The gate electrode layer 162 is provided over the first p-type semiconductor layer 120 with the gate insulating layer 160 interposed therebetween. The insulating layer 164 is provided to cover the gate insulating layer 160 and gate electrode layer 162. The first n-type semiconductor layer 130 is provided in contact with the first p-type semiconductor layer 120 and is provided on the first p-type semiconductor layer 120 and the insulating layer 164. Further, the first n-type semiconductor layer 130 is divided into two regions by a groove portion provided on the insulating layer 164. The source electrode layer 166 is provided on and in contact with one region of the first n-type semiconductor layer 130. The drain electrode layer 168 is provided on and in contact with the other region of the first n-type semiconductor layer 130.

In the LED 12, the second conductive alignment layer 210 is provided on an amorphous substrate 500. The second p-type semiconductor layer 220 is provided on and in contact with the second conductive alignment layer 210. The second n-type semiconductor layer 230 is provided over the second p-type semiconductor layer 220 with the light emitting layer 260 interposed therebetween. The n-type electrode layer 262 is provided on the second n-type semiconductor layer 230.

The transistor 11 and the LED 12 are covered with a planarization layer 502. Further, opening portions are provided in the planarization layer 502, in which one opening portion is provided on the drain electrode layer 168 of the transistor 11 and the other opening portion is provided on the n-type electrode layer 262 of the LED 12. A wiring layer 504 is provided on the planarization layer 502 and in the opening portions of the planarization layer 502. Therefore, the drain electrode layer 168 is electrically connected to the n-type electrode layer 262 via the wiring layer 504.

The first conductive alignment layer 110 can improve the crystallinity of the first p-type semiconductor layer 120 formed on the first conductive alignment layer 110. Similarly, the second conductive alignment layer 210 can improve the crystallinity of the second p-type semiconductor layer 220 formed on the second conductive alignment layer 210. Specifically, the first conductive alignment layer 110 and the second conductive alignment layer 210 can control the crystallinities of the first p-type semiconductor layer 120 and the second p-type semiconductor layer 220, respectively, so as to have a c-axis orientation. Here, "a layer has a c-axis orientation" means that the c-axis of the crystal structure of the layer is aligned in a direction substantially perpendicular to the surface on which the layer is formed. Although details are described later, specifically, a p-type semiconductor film deposited on a conductive alignment film, which is a film formed before the first conductive alignment layer 110 and the second conductive alignment layer 210 are formed by patterning, is controlled so that the c-axis of the p-type semiconductor film grows in the film thickness direction.

A conductive material having a hexagonal close-packed structure, a face-centered cubic structure, or a structure equivalent thereto can be used for each of the first conductive layer 110 and the second conductive layer 210. Here, the structure equivalent to the hexagonal close-packed structure or the face-centered cubic structure includes a crystal structure in which the c-axis is not 90 degrees with respect to the a-axis and the b-axis. Each of the first conductive layer 110 and the second conductive layer 210 using the conductive material having the hexagonal close-packed structure or the structure equivalent thereto has an orientation in the (0001) direction, that is, the c-axis direction with respect to the amorphous substrate 500 (hereinafter, referred to as a (0001) orientation of the hexagonal close-packed structure.). Further, each of the first conductive layer 110 and the second conductive layer 210 using the conductive material having the face-centered cubic structure or the structure equivalent thereto has an orientation in the (111) direction with respect to the amorphous substrate 500 (hereinafter, referred to as a (111) orientation of the face-centered cubic structure.). When the conductive alignment layer 110 and the conductive alignment layer 210 have the (0001) orientation of the hexagonal close-packed structure or the (111) orientation of the face-centered cubic structure, the crystal growth of a p-type semiconductor film deposited on the first conductive layer 110 and the second conductive layer 210 (that is, the conductive alignment film) is promoted.

Each of the first conductive alignment layer 110 and the second conductive alignment layer 210 is conductive. For example, titanium (Ti), titanium nitride ($TiN_x$), titanium oxide ($TiO_x$), graphene, zinc oxide (ZnO), magnesium diboride ($MgB_2$), aluminum (Al), silver (Ag), calcium (Ca), nickel (Ni), copper (Cu), strontium (Sr), rhodium (Rh), palladium (Pd), cerium (Ce), ytterbium (Yb), iridium (Ir), platinum (Pt), gold (Au), lead (Pb), actinium (Ac), thorium (Th), BiLaTiO, SrFeO, BiFeO, BaFeO, ZnFeO, PMnN-PZT, or the like can be used for the conductive alignment film forming the first conductive alignment layer 110 and the second conductive alignment layer 210. In particular, it is preferable to use titanium, graphene, zinc oxide, or aluminum for the conductive alignment film. In addition, the conductive alignment film can be deposited using any method (apparatus) such as sputtering or CVD.

The crystallinity of the p-type semiconductor film on the first conductive alignment layer 110 and the second alignment layer 210 (that is, the conductive alignment film) is affected by the surface condition of the conductive alignment film. Therefore, it is preferable that each of the first conductive alignment layer 110 and the second alignment layer 210 or the conductive alignment film has a smooth surface with little unevenness. For example, the arithmetic mean roughness (Ra) of the surface of each of the first conductive alignment layer 110 and the second alignment layer 210 or the conductive alignment film is preferably less than 2.3 nm. Further, the root mean square roughness (Rq) of the surface of each of the first conductive alignment layer 110 and the second alignment layer 210 or the conductive alignment film is preferably less than 2.9 nm. When the surface roughness of each of the first conductive alignment layer 110 and the second alignment layer 210 or the conductive alignment film satisfies the above conditions, the crystal growth of the p-type semiconductor film deposited on the first conductive layer 110 and the second conductive layer 210 (that is, the conductive alignment film) is further promoted in the c-axis direction. In addition, each of the thickness of the first conductive alignment layer 110 and the second conductive alignment layer 210 or the conductive alignment layer is preferably greater than or equal to 50 nm.

For example, a gallium nitride film doped with magnesium (Mg) can be used as the p-type semiconductor film forming the first p-type semiconductor layer 120 and the second p-type semiconductor layer 220. Although details are described later, the p-type semiconductor film can be deposited using sputtering. The deposition temperature of sputtering is at most about 600 degrees. Therefore, in the display device 10, the amorphous substrate 500, which has lower heat resistance than the sapphire substrate, can be used.

For example, a gallium nitride film doped with silicon (Si) can be used as an n-type semiconductor film forming the first n-type semiconductor layer 130 and the second n-type semiconductor layer 230. In addition, the n-type semiconductor film can also be deposited using sputtering.

For example, silicon oxide ($SiO_x$), silicon nitride ($SiN_x$), or the like can be used for each of the gate insulating layer 160 and the insulating layer 164. Further, for example, aluminum oxide ($AlO_x$), hafnium oxide ($HfO_x$), lanthanum oxide ($LaO_x$), or the like can be used for the gate insulating layer 160. Each of the gate insulating layer 160 and the insulating layer 164 may be a single film or a laminated film.

For example, aluminum (Al), titanium (Ti), platinum (Pt), nickel (Ni), tantalum (Ta), or gold (Au), or alloys thereof can be used for each of the gate electrode layer 162, the source electrode layer 166, and the drain electrode layer 168. Each of the gate electrode layer 162, the source electrode layer 166, and the drain electrode layer 168 may be a single film or a laminated film.

The light emitting layer 260 can recombine holes from the second p-type semiconductor layer 220 and electrons from the second n-type semiconductor layer 230 to emit light. The light emitting layer 260 has a multiple quantum well (MQW) structure. For example, a laminated film in which an indium gallium nitride (InGaN) film and a gallium nitride film are alternately laminated can be used as the light emitting layer 260.

The n-type electrode layer 262 functions as an n-type electrode that injects electrons into the second n-type semiconductor layer 230. Further, in the LED 12, the second conductive alignment layer 210 functions as a p-type electrode that injects holes into the second p-type semiconductor layer 220. When the second conductive alignment layer 210 is non-transparent, the n-type electrode layer 262 is transparent or semi-transparent. Light emitted from the light emitting layer 260 passes through the n-type electrode layer 262 and is emitted to the outside. In this case, the second conductive alignment layer 210 is preferably capable of reflecting the light emitted from the light emitting layer 260. When the second conductive alignment layer 210 has reflective properties, the light extraction efficiency of the LED 12 can be improved. On the other hand, when the second conductive alignment layer 210 is transparent or semi-transparent, the light emitted from the light emitting layer 260 passes through the second conductive alignment layer 210 and is emitted to the outside. In this case, it is preferable that the n-type electrode layer 262 can reflect the light emitted from the light emitting layer 260. When the n-type electrode layer 262 has reflective properties, the light extraction efficiency of the LED 12 can be improved.

For example, a metal such as silver (Ag) or indium (In), or a transparent conductive oxide such as indium tin oxide (ITO), indium zinc oxide (IZO), or zinc oxide (ZnO) can be used for the n-type electrode layer 262. The n-type electrode layer 262 may be a single film or a laminated film. For example, the n-type electrode layer 262 may be a laminated film including the above-mentioned metal and transparent conductive oxide.

For example, an organic insulating film such as an acrylic resin film or a polyimide resin film can be used as the planarization layer 502. The planarization layer 502 may be a single film or a laminated film. When the planarization layer 502 is a laminated film, the planarization layer may include not only the organic insulating film but also an inorganic insulating film such as a silicon oxide ($SiO_x$) film or a silicon nitride ($SiN_x$) film.

For example, a metal such as aluminum (Al), titanium (Ti), or copper (Cu), or alloys thereof can be used for the wiring layer 504. The wiring layer 504 may be a single film or a laminated film.

[3. Manufacturing Method of Transistor Formation Region 100 and LED Formation Region 200]

FIGS. 4A to 4H are schematic cross-sectional views showing a method for manufacturing the transistor formation region 100 and the LED formation region 200 of the display device 10 according to an embodiment of the present invention.

Figure 4A:
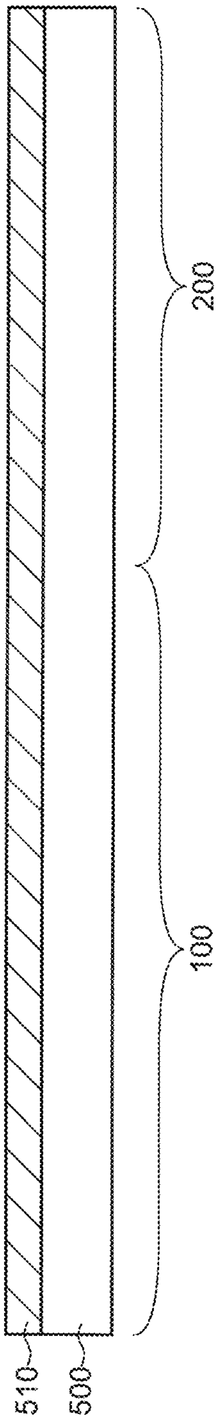
FIG. 4A is a schematic cross-sectional view showing a method for manufacturing a transistor formation region and an LED formation region of a display device according to an embodiment of the present invention.

First, as shown in FIG. 4A, a conductive alignment film 510 is deposited on the amorphous substrate 500. The conductive alignment film 510 can be deposited using any method (apparatus) such as sputtering or CVD.

Figure 4B:
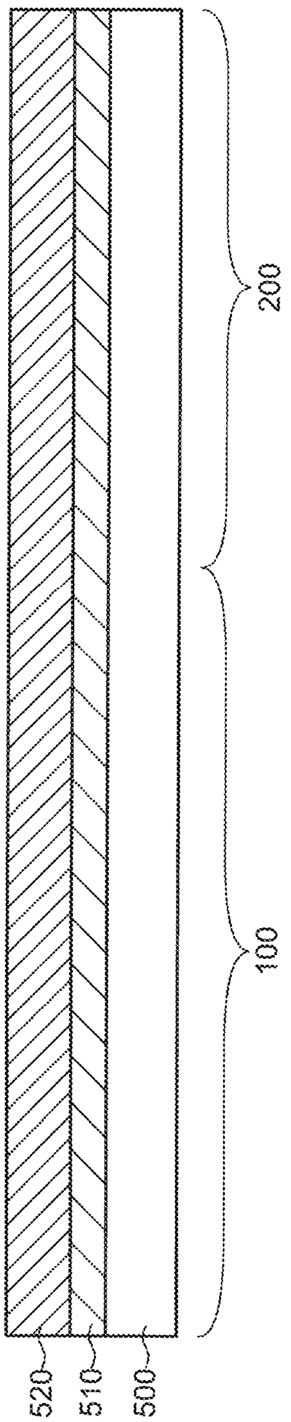
FIG. 4B is a schematic cross-sectional view showing a method for manufacturing a transistor formation region and an LED formation region of a display device according to an embodiment of the present invention.

Next, as shown in FIG. 4B, a p-type semiconductor film 520 is deposited on the conductive alignment film 510. The p-type semiconductor film 520 can be deposited using sputtering. The formation of the p-type semiconductor film 520 using sputtering is described in the following description. In addition, for convenience of explanation, the p-type semiconductor film 520 is described as a gallium nitride film doped with magnesium in the following description. However, the p-type semiconductor film 520 is not limited to the gallium nitride film doped with magnesium.

The amorphous substrate 500 on which the conductive alignment film 510 is formed is placed to face a magnesium-doped gallium nitride target in a vacuum chamber. It is preferable that the composition ratio of gallium nitride in the magnesium-doped gallium nitride target is preferably greater than or equal to 0.7 and less than or equal to 2 of gallium to nitrogen. Further, nitrogen can also be supplied to the vacuum chamber as a gas other than the sputtering gas (such as argon or krypton). In that case, it is preferable that the composition ratio of gallium nitride in the magnesium-doped gallium nitride target is more gallium than nitrogen. For example, nitrogen can be supplied using a nitrogen radical source. The sputtering power supply source may be either a DC power supply source, an RF power supply source, or a pulsed DC power supply source.

The amorphous substrate 500 in the vacuum chamber may be heated. For example, the amorphous substrate 500 can be heated at a temperature higher than or equal to 400 degrees and lower than 600 degrees. This temperature can be applied even to the amorphous substrate 500 which has lower heat resistance than a sapphire substrate. Further, this temperature is lower than the film formation temperature in MOCVD or HVPE.

After the vacuum chamber is sufficiently evacuated, the sputtering gas is supplied to the vacuum chamber. Further, a voltage is applied between the amorphous substrate 500 and the magnesium-doped gallium nitride target at a predetermined pressure to generate plasma and the gallium nitride film doped with magnesium is deposited.

Although the deposition method of the gallium nitride film doped with magnesium by sputtering is described as an example of the deposition method, the configuration or conditions of the sputtering process can be changed as appropriate. Further, an n-type semiconductor film such as a gallium nitride film doped with silicon can be deposited by using a silicon-doped gallium nitride target instead of the magnesium-doped gallium nitride target. Furthermore, a laminated film in which an indium gallium nitride film and a gallium nitride film are alternately laminated can be deposited by using an indium gallium nitride target and a gallium nitride target.

Figure 4C:
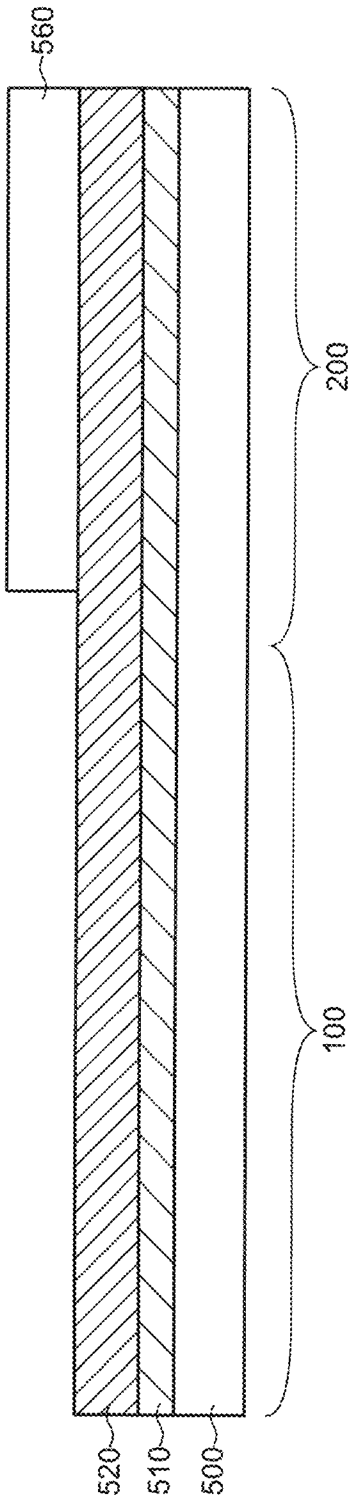
FIG. 4C is a schematic cross-sectional view showing a method for manufacturing a transistor formation region and an LED formation region of a display device according to an embodiment of the present invention.

Next, as shown in FIG. 4C, a laminated film in which an indium gallium nitride film and a gallium nitride film are alternately laminated is deposited, and then a multiple quantum well film 560 (a light emitting film 560) is formed by patterning the laminate film using photolithography.

Figure 4D:
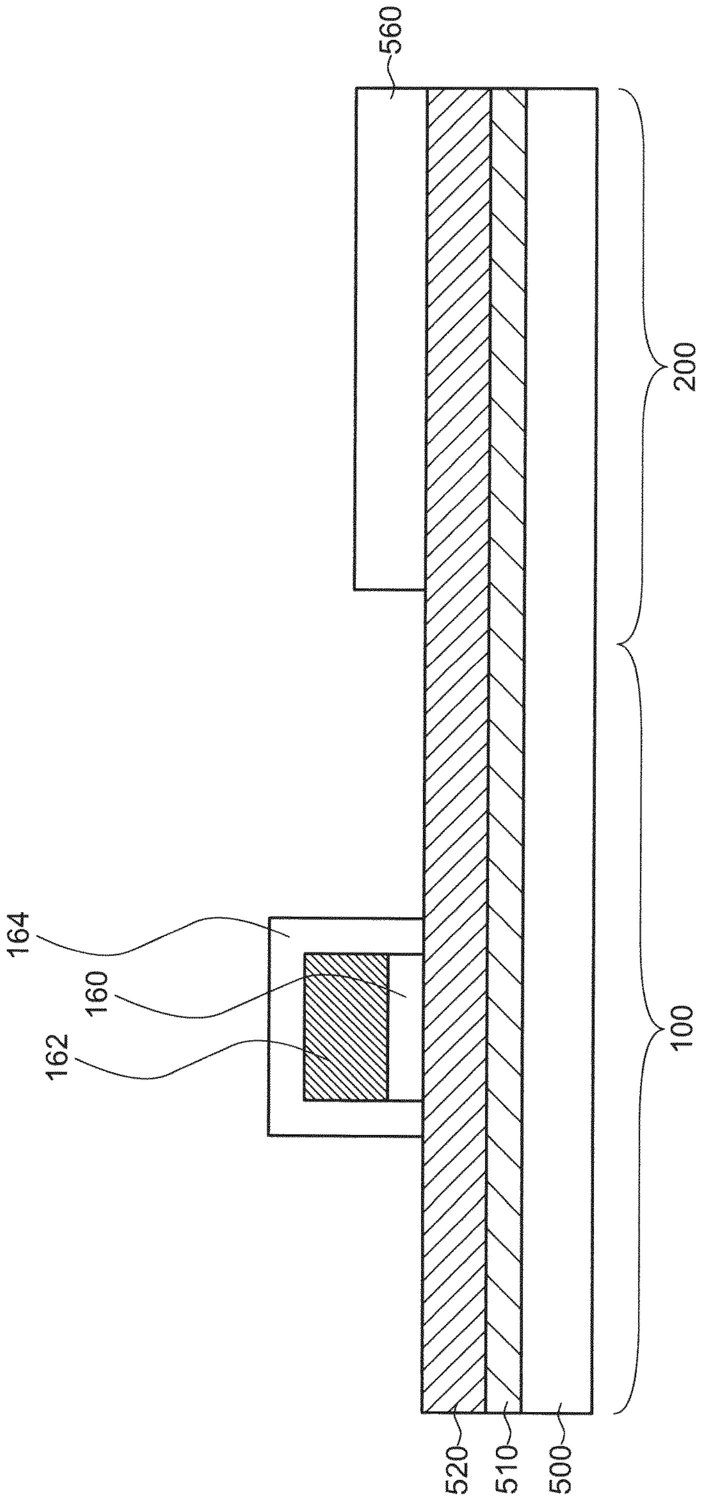
FIG. 4D is a schematic cross-sectional view showing a method for manufacturing a transistor formation region and an LED formation region of a display device according to an embodiment of the present invention.

Next, as shown in FIG. 4D, an insulating film and a metal film are deposited, and then the gate insulating layer 160 and the gate electrode layer 162 are formed in the transistor formation region 100 by patterning the insulating film and the metal film using photolithography. Further, an insulating film is deposited to cover the gate insulating layer 160 and the gate electrode layer 162, and then an insulating layer 164 is formed in the transistor formation region 100 by patterning the insulating film using photolithography.

Figure 4E:
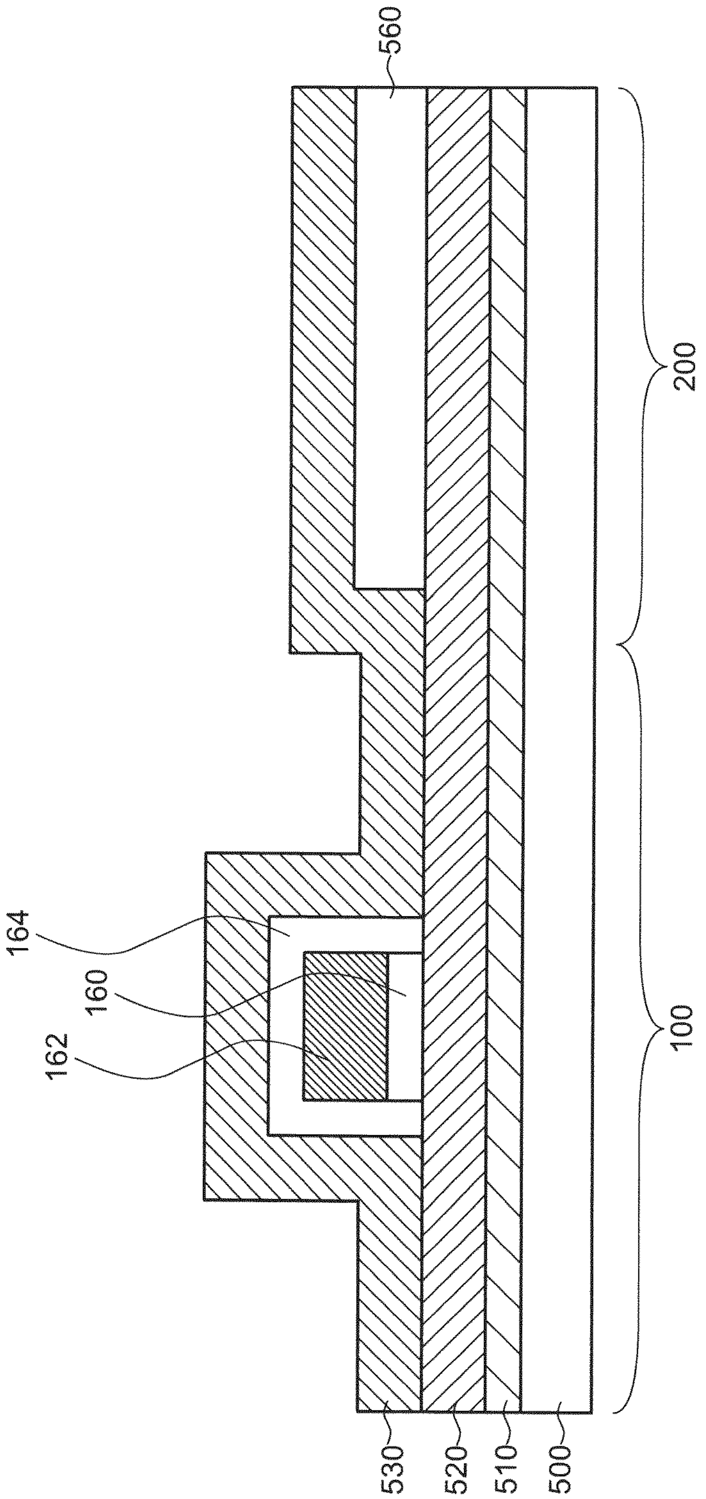
FIG. 4E is a schematic cross-sectional view showing a method for manufacturing a transistor formation region and an LED formation region of a display device according to an embodiment of the present invention.

Next, as shown in FIG. 4E, an n-type semiconductor film 530 is deposited to cover the insulating layer 164 and the multiple quantum well film 560 and to be in contact with the p-type semiconductor film 520.

Figure 4F:
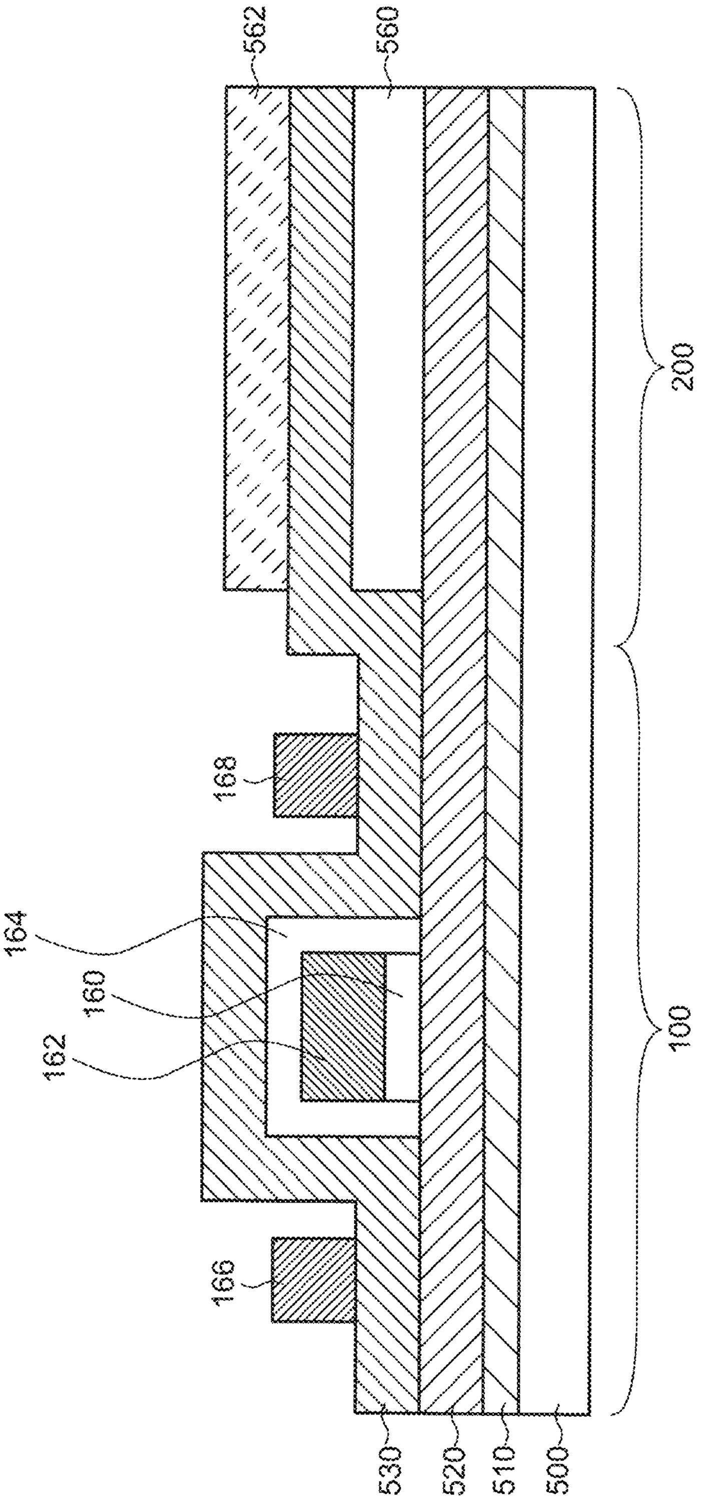
FIG. 4F is a schematic cross-sectional view showing a method for manufacturing a transistor formation region and an LED formation region of a display device according to an embodiment of the present invention.

Next, as shown in FIG. 4F, a metal film is deposited, and then the source electrode layer 166 and the drain electrode layer 168 are formed in the transistor formation region 100 by patterning the metal film using photolithography. Further, a metal film or a transparent conductive oxide film is deposited, and then an n-type electrode film 562 is formed in the LED formation region 200 by patterning the metal film or the transparent conductive oxide film using photolithography.

Figure 4G:
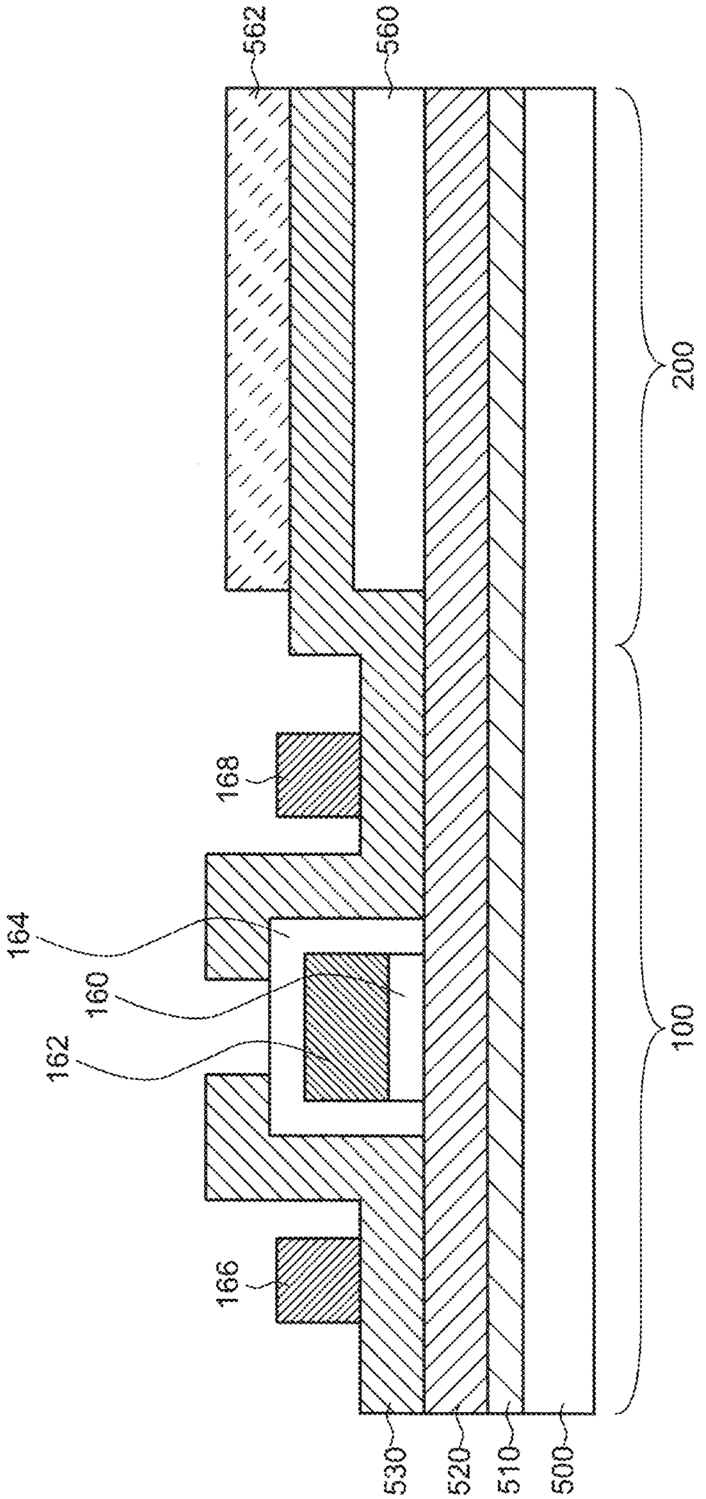
FIG. 4G is a schematic cross-sectional view showing a method for manufacturing a transistor formation region and an LED formation region of a display device according to an embodiment of the present invention.

Next, as shown in FIG. 4G, the groove portion is formed in a region where the n-type semiconductor film 530 and the gate electrode layer 162 overlap each other by patterning the n-type semiconductor film 530 using photolithography. Thus, the n-type semiconductor film 530 is divided in a region in contact with the source electrode layer 166 and a region in contact with the drain electrode layer 168.

Figure 4H:
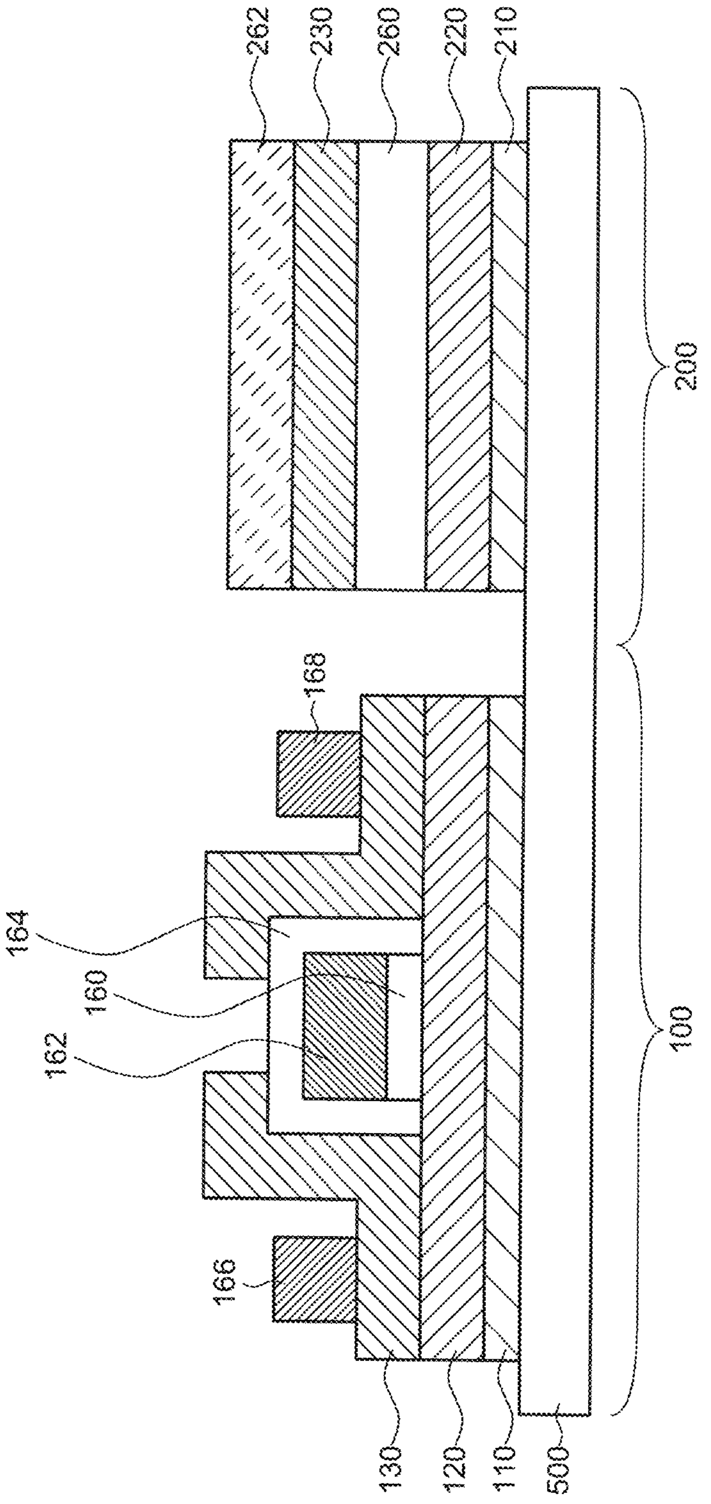
FIG. 4H is a schematic cross-sectional view showing a method for manufacturing a transistor formation region and an LED formation region of a display device according to an embodiment of the present invention.

Next, as shown in FIG. 4H, patterning is performed using photolithography so as to separate the transistor formation region 100 and the LED formation region 200. As a result, the first conductive alignment layer 110, the first p-type semiconductor layer 120, and the first n-type semiconductor layer 130 are formed in the transistor formation region 100, and the second conductive alignment layer 210, the second p-type semiconductor layer 220, the light emitting layer 260, the second n-type semiconductor layer 230, and the n-type electrode layer 262 are formed in the LED formation region 200. In other words, the transistor 11 and the LED 12 are formed on a first region and a second region different from the first region of the amorphous substrate 500, respectively.

The first conductive alignment layer 110 and the second conductive alignment layer 210 are the same layer formed by patterning the conductive alignment film 510 deposited in the step shown in FIG. 4A. Further, the first p-type semiconductor layer 120 and the second p-type semiconductor layer 220 are the same layer formed by patterning the p-type semiconductor film 520 deposited in the step shown in FIG. 4B. Furthermore, the first n-type semiconductor layer 130 and the second n-type semiconductor layer 230 are the same layer formed by patterning the n-type semiconductor film 530 deposited in the step shown in FIG. 4E.

Finally, the planarization layer 502 is formed to cover the transistor 11 and the LED 12 and to include the opening portions on the drain electrode layer 168 and the n-type electrode layer 262, and the wiring layer 504 is formed to electrically connect the drain electrode layer 168 and the n-type electrode layer 262. As a result, the transistor formation region 100 and the LED formation region 200 of the display device 10 shown in FIG. 3 are manufactured.

As described above, in the display device 10, the transistor 11 and the LED 12 are provided directly on the amorphous substrate 500. Each of the transistor 11 and the LED 12 of the display device 10 includes the conductive alignment layer (the first conductive alignment layer 110 or the second conductive alignment layer 210), the first semiconductor layer (the first p-type semiconductor layer 120 or the second p-type semiconductor layer 220), and the second semiconductor layer (the first n-type semiconductor layer 130 or the second n-type semiconductor layer 230). Each of the conductive alignment layer, the first semiconductor layer, and the second semiconductor layer is formed by patterning a film deposited in one step. Therefore, the display device 10 can be manufactured at low cost, and the manufacturing cost of the display device 10 can be suppressed.

Second Embodiment

A display device 20 according to an embodiment of the present invention is described with reference to FIGS. 5 and 6A to 6E. In the following description, when a configuration of the display device 20 is similar to the configuration of the display device 10, the description of the configuration of the display device 20 may be omitted.

[1. Configuration of Transistor Formation Region 300 and LED Formation Region 400]

Figure 5:
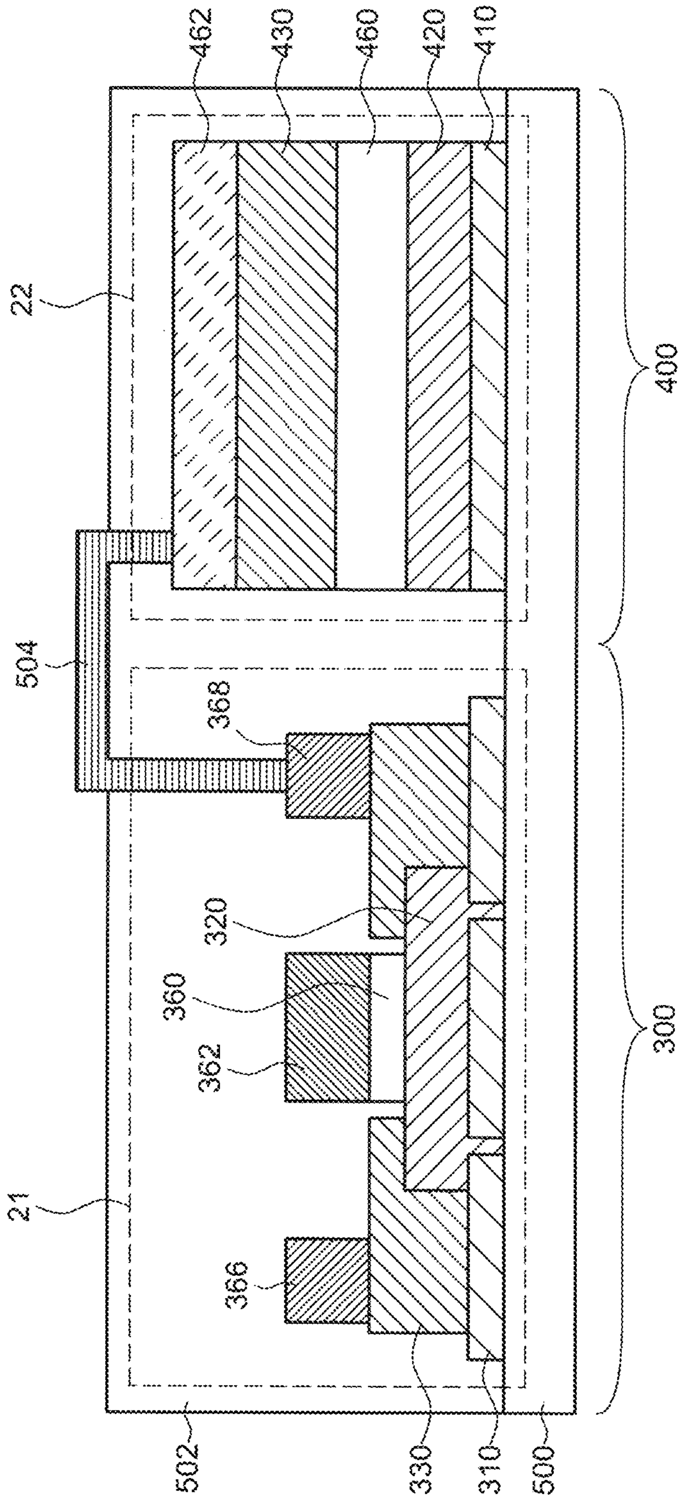
FIG. 5 is a schematic cross-sectional view showing configurations of a transistor formation region and an LED formation region of a display device according to an embodiment of the present invention.

FIG. 5 is a schematic cross-sectional view showing configurations of a transistor formation region 300 and an LED formation region 400 of the display device 20 according to an embodiment of the present invention.

In the display device 20, a transistor 21 and an LED 22 are provided on the amorphous substrate 500. That is, the transistor 21 is provided in the transistor formation region 300, and the LED 22 is provided in the LED formation region 400. The transistor 21 includes a first conductive alignment layer 310, a first p-type semiconductor layer 320, a first n-type semiconductor layer 330, a gate insulating layer 360, a gate electrode layer 362, a source electrode layer 366, and a drain electrode layer 368. The LED 22 includes a second conductive alignment layer 410, a second p-type semiconductor layer 420, a second n-type semiconductor layer 430, a light emitting layer 460, and an n-type electrode layer 462. Although details are described later, the first conductive alignment layer 310 and the second conductive alignment layer 410 are the same layer formed by patterning a film that is deposited in the same process, the first p-type semiconductor layer 320 and the second p-type semiconductor layer 420 are the same layer formed by patterning a film that is deposited in the same process, and the first n-type semiconductor layer 330 and the second n-type semiconductor layer 430 are the same layer formed by patterning a film that is deposited in the same process.

In the transistor 21, the first conductive alignment layer 310 is provided on the amorphous substrate 500. Further, the first conductive alignment layer 310 is provided with a groove portion, and the first conductive alignment layer 310 is divided into multiple regions. Specifically, the first conductive alignment layer 310 is divided into three regions including a region overlapping the gate electrode layer 362, a region overlapping the source electrode layer 366, and a region overlapping the drain electrode layer 368. The first p-type semiconductor layer 320 is provided on and in contact with the first conductive alignment layer 310. The first p-type semiconductor layer 320 may be provided to fill the groove portion of the first conductive alignment layer 310. The first n-type semiconductor layer 330 is provided on and in contact with the first conductive alignment layer 310 and the first p-type semiconductor layer 320. Further, the first n-type semiconductor layer 330 is divided into two regions by a groove portion provided on the first p-type semiconductor layer 320. The source electrode layer 366 is provided on and in contact with one region of the first n-type semiconductor layer 330. The drain electrode layer 368 is provided on and in contact with the other region of the first n-type semiconductor layer 330. The gate electrode layer 362 is provided over the first p-type semiconductor layer 320 with the gate insulating layer 360 interposed therebetween. The gate insulating layer 360 may be provided in the groove portion of the first n-type semiconductor layer 330 or may be provided so as to cover the groove portion of the first n-type semiconductor layer 330.

Since a structure of the LED 22 is similar to the structure of the LED 12, the description of the structure of the LED 22 is omitted.

The transistor 21 and the LED 22 are covered with a planarization layer 502. Further, opening portions are provided in the planarization layer 502 on the drain electrode layer 368 of the transistor 21 and on the n-type electrode layer 462 of the LED 22, respectively. A wiring layer 504 is provided on the planarization layer 502 and in the opening portions of the planarization layer 502. Therefore, the drain electrode layer 368 is electrically connected to the n-type electrode layer 462 via the wiring layer 504.

Since the first conductive alignment layer 310 has conductivity, leakage current may occur between the first conductive alignment layer 310 and the source electrode layer 366 or the drain electrode layer 368. However, in the transistor 21, the first conductive alignment layer 310 is divided into multiple regions which are insulated from each other. Therefore, in the transistor 21, leakage current between the source electrode layer 366 and the drain electrode layer 368 via the first conductive alignment layer 310 is suppressed. Further, since the first conductive alignment layer 310 is divided, the parasitic capacitance caused by the first conductive alignment layer 310 can be reduced.

In addition, the number of regions into which the first conductive alignment layer 310 is divided is not limited to three. However, in order to suppress not only the leakage current between the source electrode layer 366 and the drain electrode layer 368 but also the leakage current between the gate electrode layer 362 and the source electrode layer 366 or the drain electrode layer 368, the number of regions into which the first conductive alignment layer 310 is divided is preferably greater than or equal to three. Further, the shape of the groove portions that divide the first conductive alignment layer 310 may be in the shape of a band extending in one direction, or may be in the shape of a lattice.

[2. Manufacturing Method of Transistor Formation Region 300 and LED Formation Region 400]

FIGS. 6A to 6E are schematic cross-sectional views showing a method for manufacturing the transistor formation region 300 and the LED formation region 400 of the display device 20 according to an embodiment of the present invention.

Figure 6A:
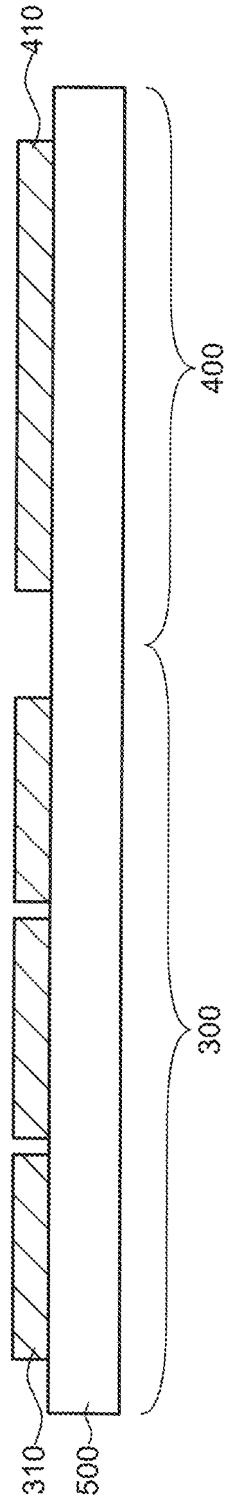
FIG. 6A is a schematic cross-sectional view showing a method for manufacturing a transistor formation region and an LED formation region of a display device according to an embodiment of the present invention.

First, as shown in FIG. 6A, a conductive alignment film is deposited on an amorphous substrate 500 by sputtering, and a first conductive alignment layer 310 and a second conductive alignment layer 410 are formed by patterning the conductive alignment film using photolithography. That is, the first conductive alignment layer 310 and the second conductive alignment layer 410 are the same layer formed by patterning the conductive alignment film deposited in the same process. In addition, the groove portion that divides the first conductive alignment layer 310 into the three regions is formed in the first conductive alignment layer 310.

Figure 6B:
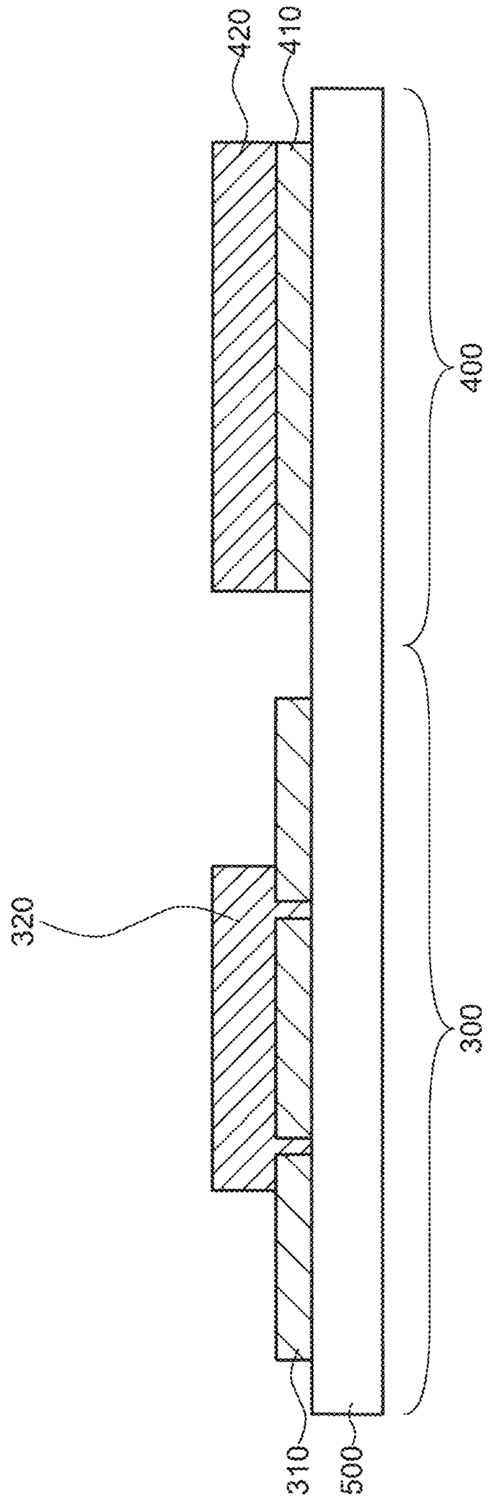
FIG. 6B is a schematic cross-sectional view showing a method for manufacturing a transistor formation region and an LED formation region of a display device according to an embodiment of the present invention.

Next, as shown in FIG. 6B, a p-type semiconductor film is deposited on the first conductive alignment layer 310 and the second conductive alignment layer 410, and the first p-type semiconductor layer 320 on the first conductive alignment layer 310 and the second p-type semiconductor layer 420 are formed by patterning the p-type semiconductor film using photolithography. That is, the first p-type semiconductor layer 320 and the second p-type semiconductor layer 420 are the same layer formed by patterning the p-type semiconductor film deposited in the same sputtering process.

Figure 6C:
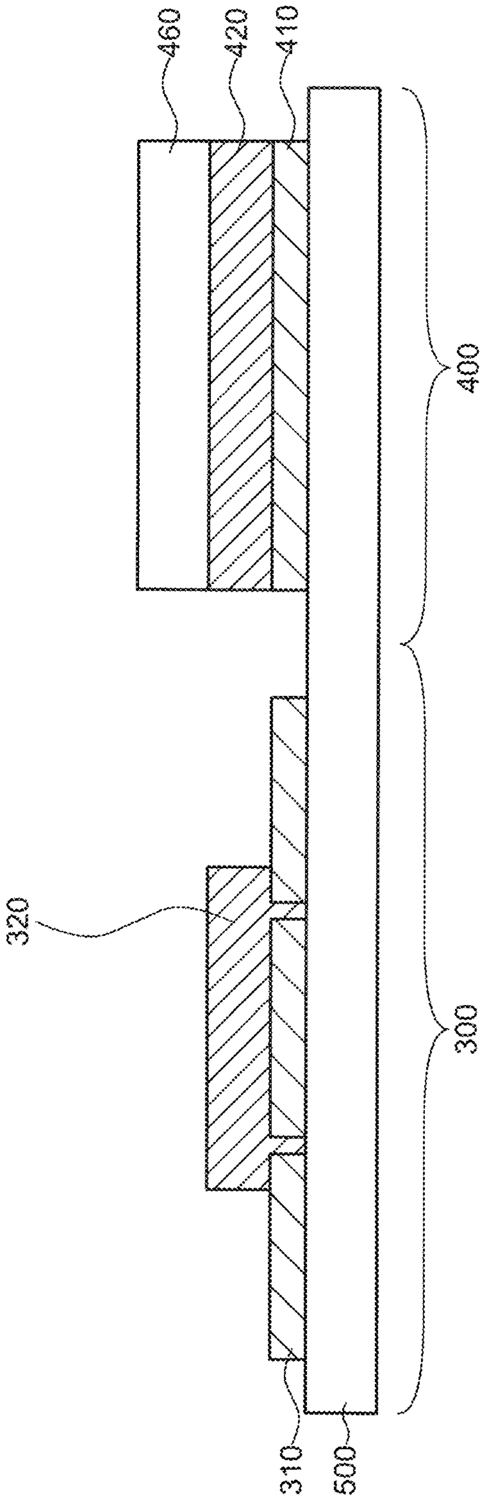
FIG. 6C is a schematic cross-sectional view showing a method for manufacturing a transistor formation region and an LED formation region of a display device according to an embodiment of the present invention.

Next, as shown in FIG. 6C, a laminated film in which an indium gallium nitride film and a gallium nitride film are alternately laminated is deposited on the second p-type semiconductor layer 420, and the light emitting layer 460 is formed by patterning the laminated film using photolithography.

Figure 6D:
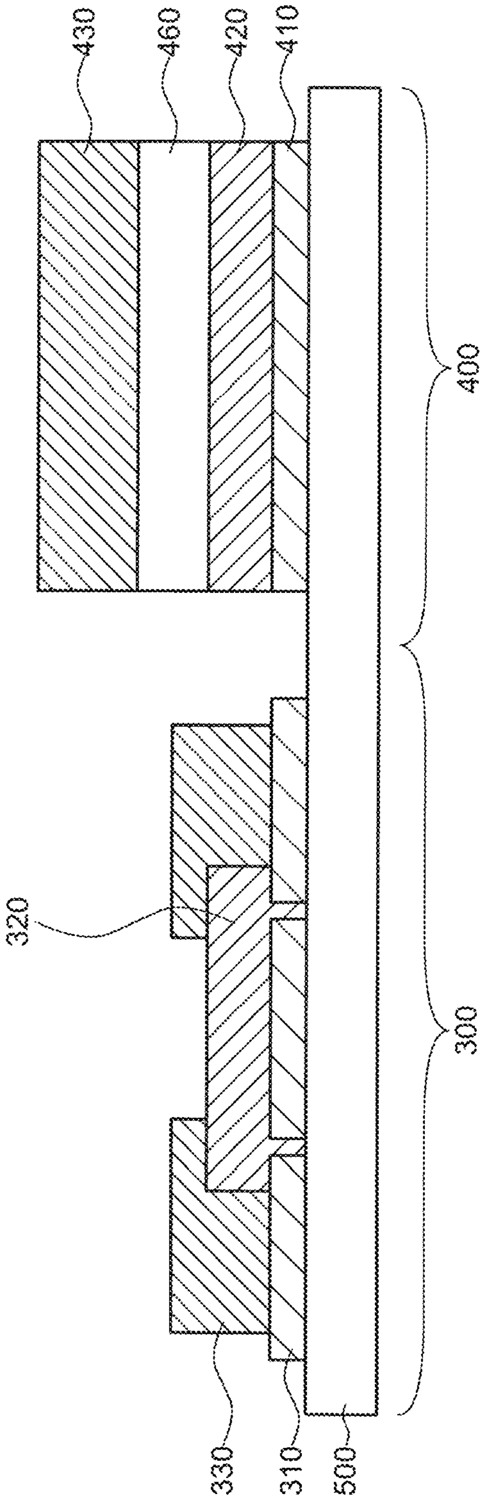
FIG. 6D is a schematic cross-sectional view showing a method for manufacturing a transistor formation region and an LED formation region of a display device according to an embodiment of the present invention.

Next, as shown in FIG. 6D, an n-type semiconductor film is deposited by sputtering on the first conductive alignment layer 310, the first p-type semiconductor layer 320, and the light-emitting layer 460, and then the first n-type semiconductor layer 330 on the first p-type semiconductor layer 310 and the second n-type semiconductor 430 on the light emitting layer 460 are formed by patterning the n-type semiconductor film using photolithography. That is, the first n-type semiconductor layer 330 and the second n-type semiconductor layer 430 are the same layer formed by patterning the n-type semiconductor film deposited in the same sputtering process. In addition, a groove portion is formed in the first n-type semiconductor layer 330 to divide the first n-type semiconductor layer 330 into two regions. One region of the first n-type semiconductor layer 330 is in contact with one of the three regions of the first conductive alignment layer 310, and the other region of the first n-type semiconductor layer 330 is in contact with the other of the three regions of the first conductive alignment layer 310.

Figure 6E:
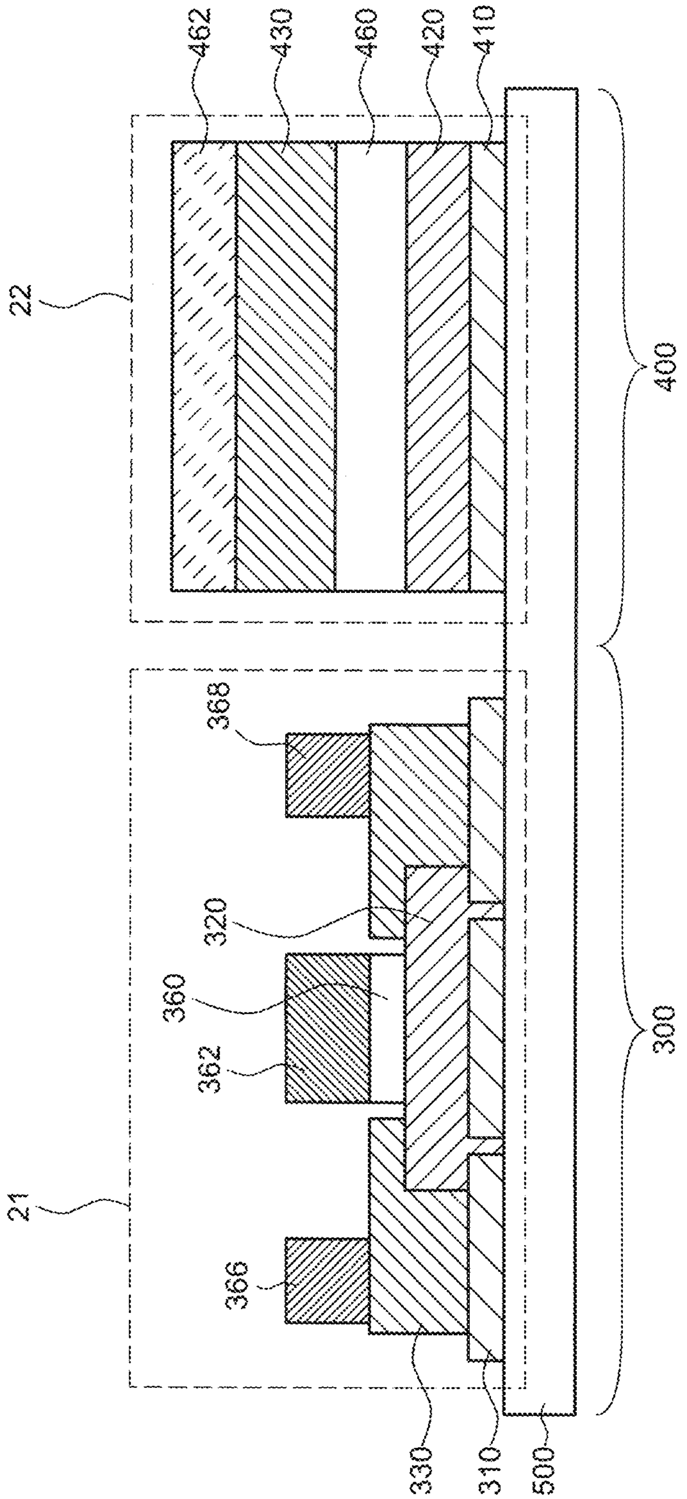
FIG. 6E is a schematic cross-sectional view showing a method for manufacturing a transistor formation region and an LED formation region of a display device according to an embodiment of the present invention.

Next, as shown in FIG. 6E, an insulating film and a metal film are formed over at least the first p-type semiconductor layer 320, and then the gate insulating layer 360 and the gate electrode layer 362 are formed by patterning the insulating film and the metal film using photolithography. Further, a metal film is formed on at least the first n-type semiconductor layer 330, and then the source electrode layer 366 and the drain electrode layer 368 are formed by patterning the metal film using photolithography. The source electrode layer 366 is in contact with one of the two regions of the first n-type semiconductor layer 330, and the drain electrode layer 368 is in contact with the other of the two regions of the first n-type semiconductor layer 330. Furthermore, a metal film or a transparent conductive oxide film is formed on at least the second n-type semiconductor layer 430, and then the n-type electrode layer 462 is formed by patterning the metal film or the transparent conductive oxide film using photolithography. As a result, the transistor 21 is formed in the transistor formation region 300, and the LED 22 is formed in the LED formation region 400.

Finally, the planarization layer 502 is formed to cover the transistor 21 and the LED 22 and include the opening portions on the drain electrode layer 368 and the n-type electrode layer 462, and the wiring layer 504 is formed to electrically connect the drain electrode layer 368 and the n-type electrode layer 462. As a result, the transistor formation region 300 and the LED formation region 400 of the display device 20 shown in FIG. 5 are manufactured.

As described above, in the display device 20, the transistor 21 and the LED 22 are provided directly on the amorphous substrate 500. Each of the transistor 21 and the LED 22 of the display device 20 includes the conductive alignment layer (the first conductive alignment layer 310 or the second conductive alignment layer 410), the first semiconductor layer (the first p-type semiconductor layer 320 or the second p-type semiconductor layer 420), and the second semiconductor layer (the first n-type semiconductor layer 330 or the second n-type semiconductor layer 430). Each of the conductive alignment layer, the first semiconductor layer, and the second semiconductor layer is formed by patterning a film deposited in one step. Therefore, the display device 20 can be manufactured at low cost, and the manufacturing cost of the display device 20 can be suppressed.

<Modification 1>

A display device 20A according to a modification of the Second Embodiment is described with reference to FIGS. 7, 8A, and 8B. In the following description, when a configuration of the display device 20A is similar to the configuration of the display device 20, the description of the configuration of the display device 20A may be omitted.

[1. Configuration of Transistor Formation Region 300A and LED Formation Region 400A]

Figure 7:
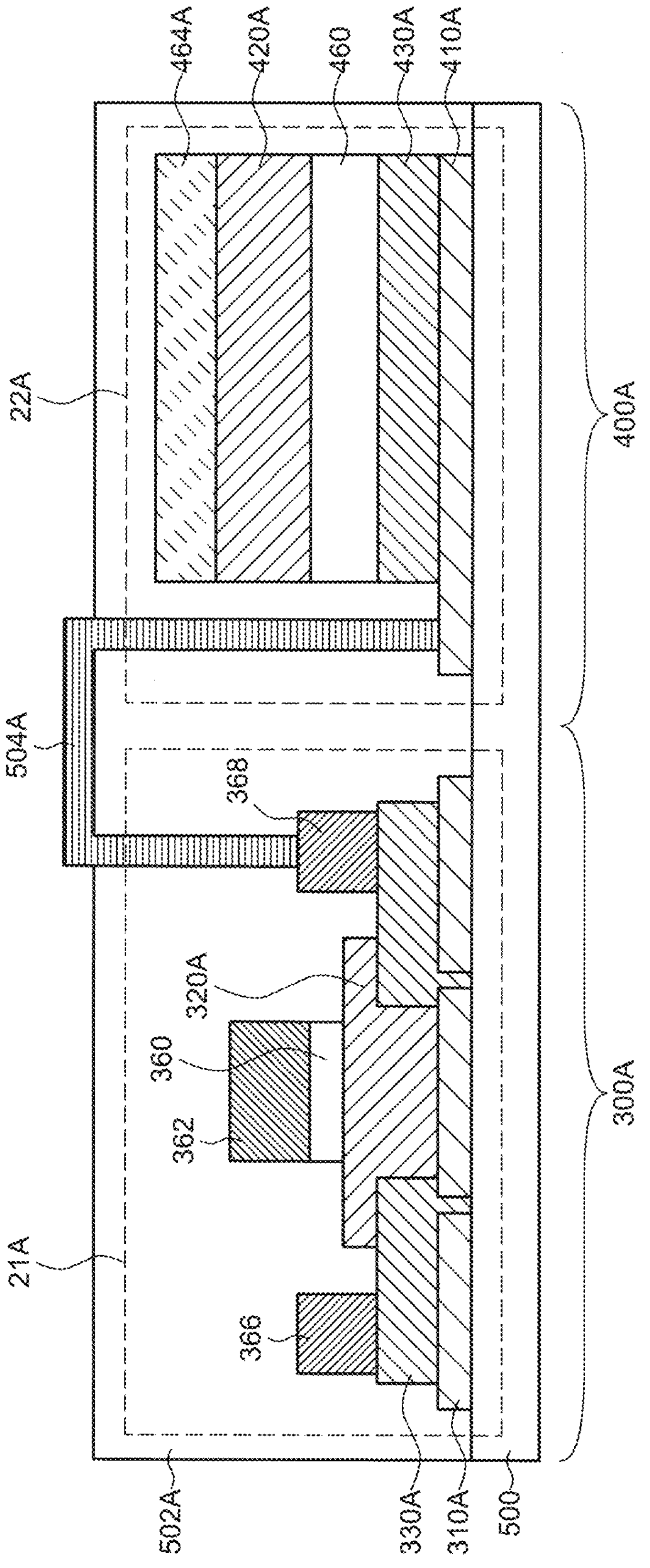
FIG. 7 is a schematic cross-sectional view showing configurations of a transistor formation region and an LED formation region of a display device according to an embodiment of the present invention.

FIG. 7 is a schematic cross-sectional view showing configurations of a transistor formation region 300A and an LED formation region 400A of the display device 20A according to an embodiment of the present invention.

In the display device 20A, a transistor 21A and an LED 22 are provided on the amorphous substrate 500. That is, the transistor 21A is provided in the transistor formation region 300A, and the LED 22A is provided in the LED formation region 400A. The transistor 21A includes a first conductive alignment layer 310A, a first n-type semiconductor layer 330A, a first p-type semiconductor layer 320A, a gate insulating layer 360, a gate electrode layer 362, a source electrode layer 366, and a drain electrode layer 368. The LED 22A includes a second conductive alignment layer 410A, a second n-type semiconductor layer 430A, a second p-type semiconductor layer 420A, a light emitting layer 460, and a p-type electrode layer 464A. Although details are described later, the first conductive alignment layer 310A and the second conductive alignment layer 410A are the same layer formed by patterning a film that is deposited in the same process, the first p-type semiconductor layer 320A and the second p-type semiconductor layer 420A are the same layer formed by patterning a film that is deposited in the same process, and the first n-type semiconductor layer 330A and the second n-type semiconductor layer 430A are the same layer formed by patterning a film that is deposited in the same process.

In the transistor 21A, the first conductive alignment layer 310A is provided on the amorphous substrate 500. Further, the first conductive alignment layer 310A is provided with a groove portion, and the first conductive alignment layer 310A is divided into multiple regions. Specifically, the first conductive alignment layer 310A is divided into three regions including a region overlapping the gate electrode layer 362, a region overlapping the source electrode layer 366, and a region overlapping the drain electrode layer 368. The first n-type semiconductor layer 330A is provided on and in contact with the first conductive alignment layer 310A. Further, the first n-type semiconductor layer 330A is divided into two regions by a groove portion provided on one of the three regions of the first conductive alignment layer 310A. The source electrode layer 366 is provided on and in contact with one of the two regions of the first n-type semiconductor layer 330A. The drain electrode layer 368 is provided on and in contact with the other of the two regions of the first n-type semiconductor layer 330A. The first p-type semiconductor layer 320A is provided on and in contact with the first conductive alignment layer 310A and the first n-type semiconductor layer 330A. Specifically, the first p-type semiconductor layer 320A is provided so as to cover the groove portion provided in the first n-type semiconductor layer 330A, and is in contact with one of the three regions of the first conductive alignment layer 310A that is exposed in the groove portion. The gate electrode layer 362 is provided over the first p-type semiconductor layer 320A with the gate insulating layer 360 interposed therebetween.

In the LED 22A, the second conductive alignment layer 410A is provided on the amorphous substrate 500. The second n-type semiconductor layer 430A is provided on and in contact with the second conductive alignment layer 410A. The second p-type semiconductor layer 420A is provided over the second n-type semiconductor layer 430A with the light emitting layer 460 interposed therebetween. The p-type electrode layer 464A is provided on the second p-type semiconductor layer 420A.

The transistor 21A and the LED 22A are covered with a planarization layer 502A. Further, opening portions are provided in the planarization layer 502A on the drain electrode layer 368 of the transistor 21A and on the second conductive alignment layer 410A of the LED 12, respectively. A wiring layer 504A is provided on the planarization layer 502A and in the opening portions of the planarization layer 502A. Therefore, the drain electrode layer 368 is electrically connected to the second conductive alignment layer 410A via the wiring layer 504A.

The p-type electrode layer 464A functions as a p-type electrode that injects holes into the second p-type semiconductor layer 420A. Further, in the LED 22A, the second conductive alignment layer 410A functions as an n-type electrode that injects electrons into the second n-type semiconductor layer 430A. When the second conductive alignment layer 410A is non-transparent, the p-type electrode layer 464A is transparent or semi-transparent. Light emitted from the light emitting layer 460 passes through the p-type electrode layer 464A and is emitted to the outside. In this case, the second conductive alignment layer 410A is preferably capable of reflecting the light emitted from the light emitting layer 460. When the second conductive alignment layer 410A has reflective properties, the light extraction efficiency of the LED 22A can be improved. On the other hand, when the second conductive alignment layer 410A is transparent or semi-transparent, the light emitted from the light emitting layer 460 passes through the second conductive alignment layer 410A and is emitted to the outside. In this case, it is preferable that the p-type electrode layer 464A can reflect the light emitted from the light emitting layer 460. When the p-type electrode layer 464A has reflective properties, the light extraction efficiency of the LED 22A can be improved.

For example, a metal such as gold (Au) or platinum (Pt), or a transparent conductive oxide such as indium tin oxide (ITO), indium zinc oxide (IZO), or zinc oxide (ZnO) can be used for the p-type electrode layer 464A. The p-type electrode layer 464A may be a single film or a laminated film. For example, the p-type electrode layer 464A may be a laminated film including the above-mentioned metal and transparent conductive oxide.

Since the first conductive alignment layer 310A has conductivity, leakage current may occur between the first conductive alignment layer 310A and the source electrode layer 366 or the drain electrode layer 368. However, in the transistor 21A, the first conductive alignment layer 310A is divided into multiple regions which are insulated from each other. Therefore, in the transistor 21A, leakage current between the source electrode layer 366 and the drain electrode layer 368 via the first conductive alignment layer 310A is suppressed. Further, since the first conductive alignment layer 310A is divided, the parasitic capacitance caused by the first conductive alignment layer 310A can be reduced.

[2. Manufacturing Method of Transistor Formation Region 300A and LED Formation Region 400A]

Figure 8A:
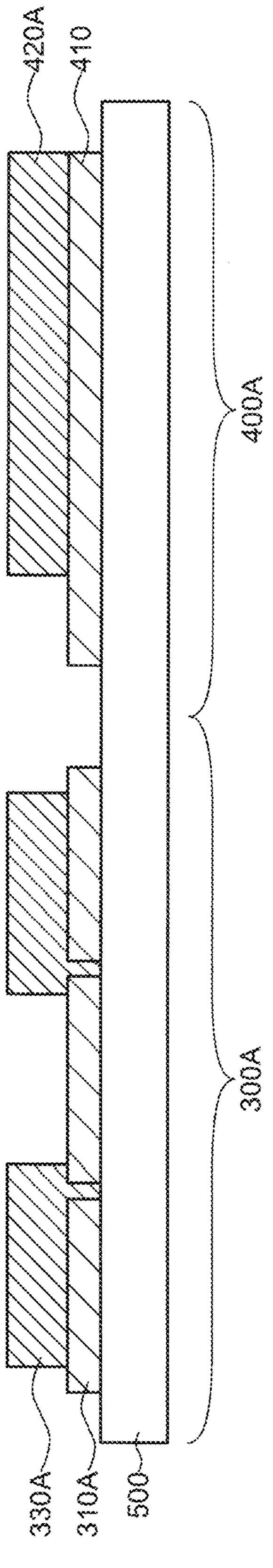
FIG. 8A is a schematic cross-sectional view showing a method for manufacturing a transistor formation region and an LED formation region of a display device according to an embodiment of the present invention.
Figure 8B:
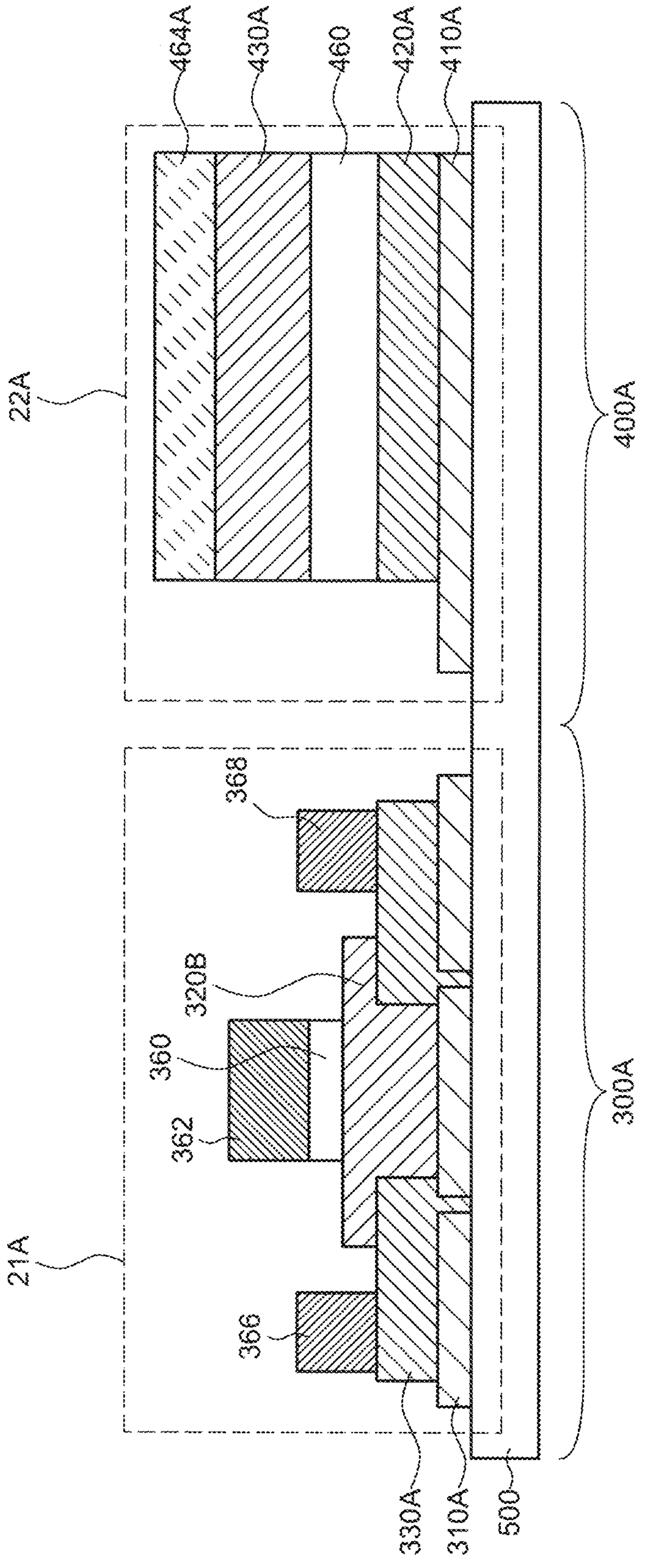
FIG. 8B is a schematic cross-sectional view showing a method for manufacturing a transistor formation region and an LED formation region of a display device according to an embodiment of the present invention.

FIGS. 8A and 8B are schematic cross-sectional views showing a method for manufacturing the transistor formation region 300A and the LED formation region 400A of the display device 20A according to an embodiment of the present invention.

As shown in FIG. 8A, a conductive alignment film is deposited on the amorphous substrate 500 by sputtering, and then the first conductive alignment layer 310A and the second conductive alignment layer 410A are formed in the transistor formation region 300A and the LED formation region 400A, respectively, by patterning the conductive alignment film using photolithography. That is, the first conductive alignment layer 310A and the second conductive alignment layer 410A are the same layer formed by patterning the conductive alignment film deposited in the same sputtering process. In addition, the groove portion that divides the first conductive alignment layer 310A into the three regions is formed in the first conductive layer 310A.

Further, an n-type semiconductor film is deposited on the first conductive alignment layer 310A and the second conductive alignment layer 410A by sputtering, and then the first n-type semiconductor layer 330A on the first alignment layer 310A and the second n-type semiconductor layer 430A on the second alignment layer 410A are formed by patterning the n-type semiconductor film using photolithography. That is, the first n-type semiconductor layer 330A and the second n-type semiconductor layer 430A are the same layer formed by patterning the n-type semiconductor film deposited in the same sputtering process. In addition, the groove portion that divides the first n-type semiconductor layer 330A into the two regions is formed. Further, the second n-type semiconductor layer 430A is formed on a part of the second conductive alignment layer 410A so that a part of the surface of the second conductive alignment layer 410A is exposed.

Next, as shown in FIG. 8B, a laminated film in which an indium gallium nitride film and a gallium nitride film are alternately laminated is deposited on the second n-type semiconductor layer 430A, and then the light emitting layer 460 is formed by patterning the laminated film using photolithography.

Further, a p-type semiconductor film is deposited by sputtering on the first conductive alignment layer 310A, the first n-type semiconductor layer 330A, and the light emitting layer 460, and then the first p-type semiconductor layer 320A on the first alignment layer 310A and the first n-type semiconductor layer 330A and the second p-type semiconductor layer 420A on the light emitting layer 460 are formed by patterning the p-type semiconductor film using photolithography. That is, the first p-type semiconductor layer 320A and the second p-type semiconductor layer 420A are the same layer formed by patterning the p-type semiconductor film deposited in the same sputtering process. In addition, the first p-type semiconductor layer 320A is provided to cover the groove portion provided in the first n-type semiconductor layer 330A, and is in contact with one of the three regions of the first conductive alignment layer that is exposed by the groove portion provided in the first n-type semiconductor layer 330A.

Further, an insulating film and a metal film are deposited on at least the first p-type semiconductor layer 320A, and then the gate insulating layer 360 and the gate electrode layer 362 are formed by patterning the insulating film and the metal film using photolithography. Furthermore, a metal film is deposited on at least the first n-type semiconductor layer 330A, and then the source electrode layer 366 and the drain electrode layer 368 are formed by patterning the metal film using photolithography. The source electrode layer 366 is in contact with one of the two regions of the first n-type semiconductor layer 330A, and the drain electrode layer 368 is in contact with the other of the two regions of the first n-type semiconductor layer 330A. Moreover, a metal film or a transparent conductive oxide film is deposited on at least the second p-type semiconductor layer 420A, and then the p-type electrode layer 464A is formed by patterning the metal film or the transparent conductive oxide film using photolithography. As a result, the transistor 21A is formed in the transistor formation region 300A, and the LED 22A is formed in the LED formation region 400A.

Finally, the planarization layer 502A is formed to cover the transistor 21*a* and the LED 22A and include the opening portions on the drain electrode layer 368 and the n-type electrode layer 462, and the wiring layer 504A is formed to electrically connect the drain electrode layer 368 and the second alignment layer 410. As a result, the transistor formation region 300A and the LED formation region 400A of the display device 20A shown in FIG. 7 are manufactured.

As described above, in the display device 20A, the transistor 21A and the LED 22A are provided directly on the amorphous substrate 500. Each of the transistor 21A and the LED 22A of the display device 20 includes the conductive alignment layer (the first conductive alignment layer 310A or the second conductive alignment layer 410A), the first semiconductor layer (the first n-type semiconductor layer 330A or the second n-type semiconductor layer 430A), and the second semiconductor layer (the first p-type semiconductor layer 320A or the second p-type semiconductor layer 420A). Each of the conductive alignment layer, the first semiconductor layer, and the second semiconductor layer is formed by patterning a film deposited in one step. Therefore, the display device 20A can be manufactured at low cost, and the manufacturing cost of the display device 20A can be suppressed.

Third Embodiment

A display device 30 according to an embodiment of the present invention is described with reference to FIG. 9. In the following description, when a configuration of the display device 30 is similar to the configuration of the display device 10, the description of the configuration of the display device 30 may be omitted.

Figure 9:
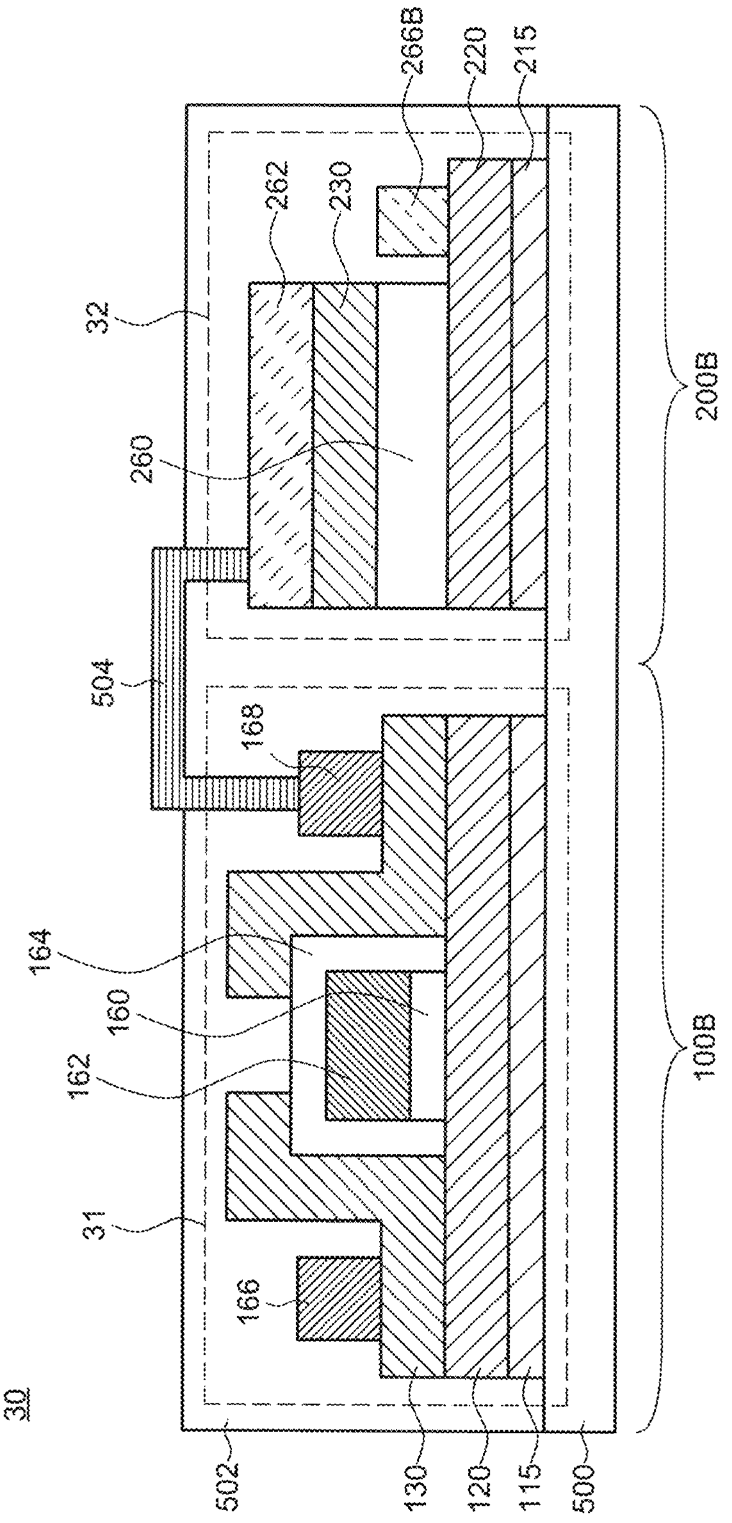
FIG. 9 is a schematic cross-sectional view showing configurations of a transistor formation region and an LED formation region of a display device according to an embodiment of the present invention.

FIG. 9 is a schematic cross-sectional view showing configurations of a transistor formation region 100B and an LED formation region 200B of the display device 30 according to an embodiment of the present invention.

In the display device 30, a transistor 31 and an LED 32 are provided on the amorphous substrate 500. That is, the transistor 31 is provided in the transistor formation region 100B, and the LED 32 is provided in the LED formation region 200B. The transistor 31 includes a first insulating alignment layer 115, the first p-type semiconductor layer 120, the first n-type semiconductor layer 130, the gate insulating layer 160, the gate electrode layer 162, the insulating layer 164, the source electrode layer 166, and the drain electrode layer 168. The LED 32 includes a second insulating alignment layer 215, the second p-type semiconductor layer 220, the second n-type semiconductor layer 230, the light emitting layer 260, the n-type electrode layer 262, and the p-type electrode layer 266B. The first insulating alignment layer 115 and the second insulating alignment layer 215 are the same layer formed by patterning a film deposited in the same process. That is, in the display device 30, the first insulating alignment layer 115 and the second insulating alignment layer 215 are provided instead of the first conductive alignment layer 110 and the second conductive alignment layer 210 of the display device 10.

An insulating material having a hexagonal close-packed structure, a face-centered cubic structure, or a structure equivalent thereto can be used for each of the first insulating alignment layer 115 and the second insulating alignment layer 215. Each of the first insulating alignment layer 115 and the second insulating alignment layer 215 does not have electrical conductivity. In other words, each of the first insulating alignment layer 115 and the second insulating alignment layer 215 is insulating. For example, aluminum nitride (AlN), gallium oxide (GaO), aluminum oxide ($Al_2O_3$), lithium niobate (LiNbO), BiLaTiO, SrFeO, SrFeO, BiFeO, BaFeO, ZnFeO, PMnN-PZT, bioapatite (BAp) or the like can be used for an insulating alignment film forming the first insulating alignment layer 115 and the second insulating alignment layer 215. In particular, it is preferable to use aluminum nitride (AlN) as the insulating alignment film. In addition, the insulating alignment film can be deposited using any method (apparatus) such as sputtering or CVD.

As described above, since the second insulating alignment layer 215 does not have conductivity, the second insulating alignment layer 215 does not function as a p-type electrode. Therefore, in the LED 32, a p-type electrode layer 266B is provided on a region where the second p-type semiconductor layer 220 is exposed (the region of the second p-type semiconductor layer 220 does not overlap the second n-type semiconductor layer 230, the light emitting layer 260, and the n-type electrode layer 262).

A metal such as gold (Au) or platinum (Pt), or a transparent conductive oxide such as indium tin oxide (ITO), indium zinc oxide (IZO), or zinc oxide (ZnO) can be used for the p-type electrode layer 266B. The p-type electrode layer 266B may be a single film or a laminated film. For example, the p-type electrode layer 266B may be a laminated film including the above-mentioned metal and transparent conductive oxide. For example, the p-type electrode layer 266B is formed on the second p-type semiconductor layer 220 which is exposed by etching a part of the stacked structure of the n-type electrode layer 262, the second n-type semiconductor layer 230, and the light emitting layer 260.

As described above, in the display device 30, the transistor 31 and the LED 32 are provided directly on the amorphous substrate 500. Each of the transistor 31 and the LED 32 of the display device 30 includes the insulating alignment layer (the first insulating alignment layer 115 or the second insulating alignment layer 215), the first semiconductor layer (the first p-type semiconductor layer 120 or the second p-type semiconductor layer 220), and the second semiconductor layer (the first n-type semiconductor layer 130 or the second n-type semiconductor layer 230). Each of the insulating alignment layer, the first semiconductor layer, and the second semiconductor layer is formed by patterning a film deposited in one step. Therefore, the display device 30 can be manufactured at low cost, and the manufacturing cost of the display device 30 can be suppressed.

<Modification 1>

A display device 30C according to a modification of the Third Embodiment is described with reference to FIG. 10. In the following description, when a configuration of the display device 30C is similar to the configuration of the display device 30, the description of the configuration of the display device 30C may be omitted.

Figure 10:
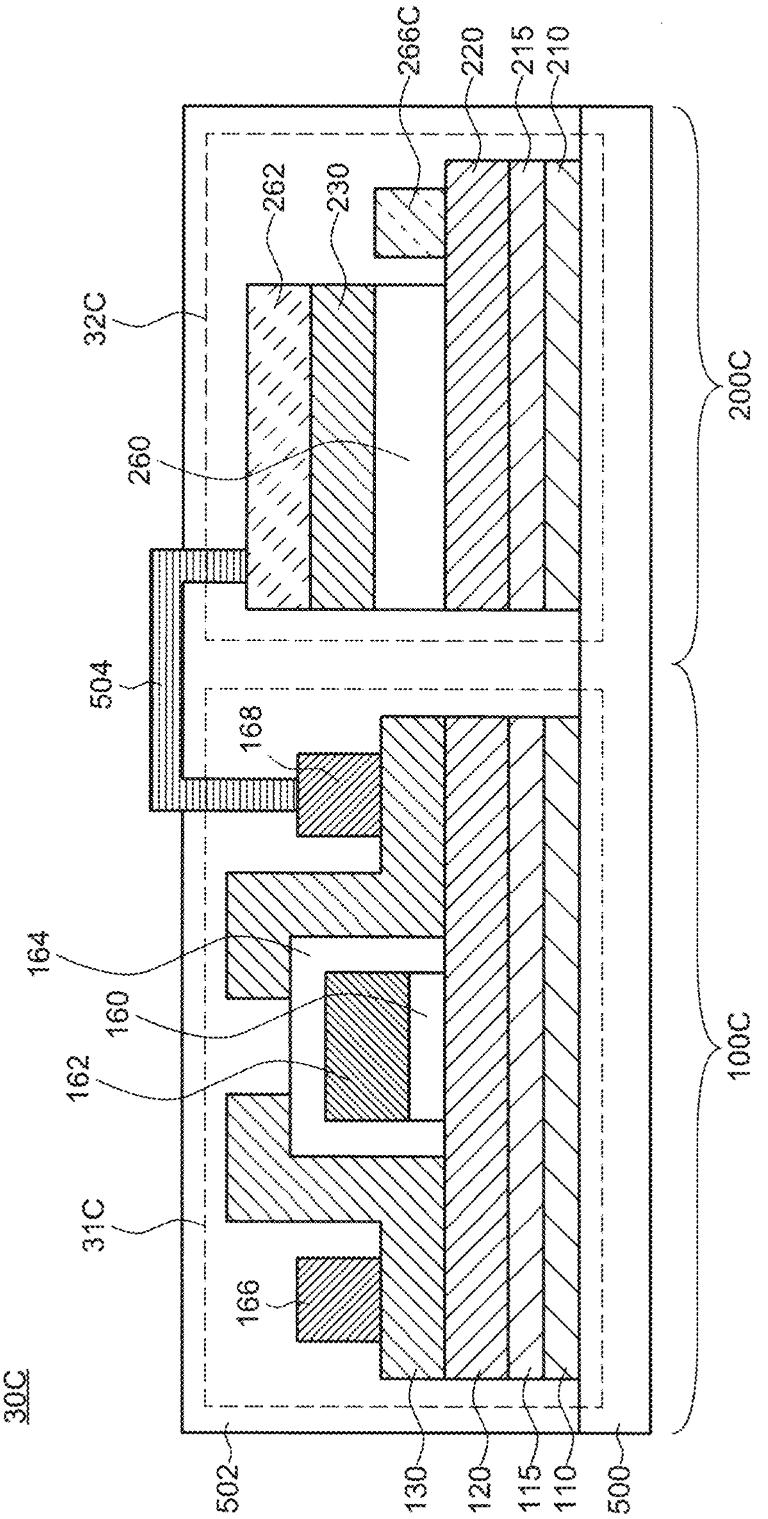
FIG. 10 is a schematic cross-sectional view showing configurations of a transistor formation region and an LED formation region of a display device according to an embodiment of the present invention.

FIG. 10 is a schematic cross-sectional view showing configurations of a transistor formation region 1000 and an LED formation region 2000 of the display device 30C according to an embodiment of the present invention.

In the display device 30C, a transistor 31C and an LED 32C are provided on an amorphous substrate 500. That is, the transistor 31C is provided in the transistor formation region 1000, and the LED 32C is provided in the LED formation region 2000. The transistor 31C includes the first conductive alignment layer 110, the first insulating alignment layer 115, the first p-type semiconductor layer 120, the first n-type semiconductor layer 130, the gate insulating layer 160, the gate electrode layer 162, the insulating layer 164, the source electrode layer 166, and the drain electrode layer 168. The LED 32 includes the second conductive alignment layer 210, the second insulating alignment layer 215, the second p-type semiconductor layer 220, the second n-type semiconductor layer 230, the light emitting layer 260, the n-type electrode layer 262, and the p-type electrode layer 266C. The first conductive alignment layer 110 and the second conductive alignment layer 210 are the same layer formed by patterning a film deposited in the same step. Further, the first insulating alignment layer 115 and the second insulating alignment layer 215 are the same layer formed by patterning a film deposited in the same step.

In the display device 30C, a stacked structure of a conductive alignment layer (the first conductive alignment layer 110 or the second conductive alignment layer 210) and an insulating alignment layer (the first insulating alignment layer 115 or the second insulating alignment layer 215) is used for controlling the c-axis orientation of the p-type semiconductor film deposited by sputtering. The insulating alignment layer formed on the conductive alignment layer is affected by the conductive alignment layer to a small degree. Therefore, when the c-axis orientation of a p-type semiconductor film deposited on a single layer of the insulating alignment layer is insufficient, the properties of the insulating alignment layer can be controlled by forming the conductive alignment layer in contact with the insulating alignment layer. That is, the stacked structure of the conductive alignment layer and the insulating alignment layer can further improve the crystallinity of the p-type semiconductor film.

As described above, in the display device 30C, the transistor 31C and the LED 32C are provided directly on the amorphous substrate 500. Each of the transistor 31C and the LED 32C of the display device 30C includes the conductive alignment layer (the first conductive alignment layer 110 or the second conductive alignment layer 210), the insulating alignment layer (the first insulating alignment layer 115 or the second insulating alignment layer 215), the first semiconductor layer (the first p-type semiconductor layer 120 or the second p-type semiconductor layer 220), and the second semiconductor layer (the first n-type semiconductor layer 130 or the second n-type semiconductor layer 230). Each of the conductive alignment layer, the insulating alignment layer, the first semiconductor layer, and the second semiconductor layer is formed by patterning a film deposited in one step. Therefore, the display device 30 can be manufactured at low cost, and the manufacturing cost of the display device 30 can be suppressed.

Fourth Embodiment

A display device 40 according to an embodiment of the present invention is described with reference to FIG. 11. In the following description, when a configuration of the display device 40 is similar to the configuration of the display device 20 or the display device 30, the description of the configuration of the display device 40 may be omitted.

Figure 11:
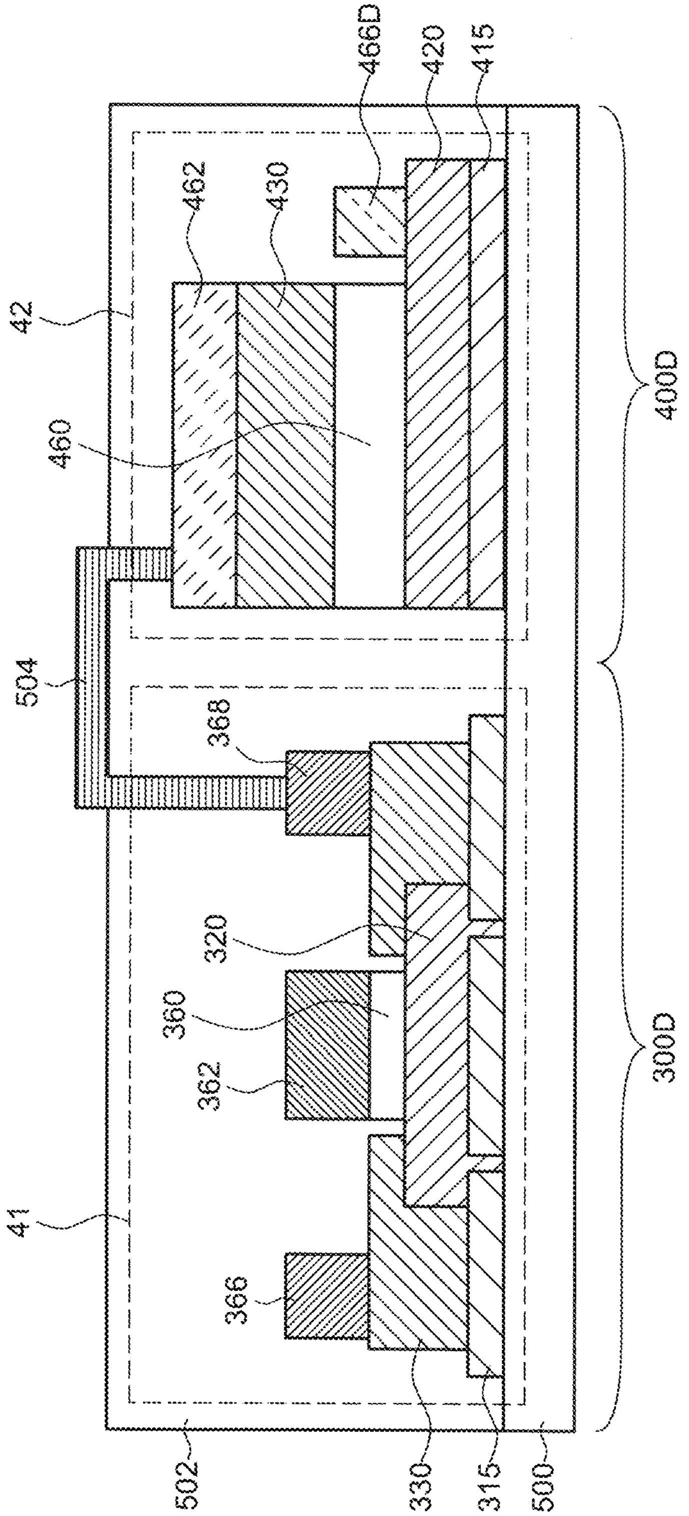
FIG. 11 is a schematic cross-sectional view showing configurations of a transistor formation region and an LED formation region of a display device according to an embodiment of the present invention.

FIG. 11 is a schematic cross-sectional view showing configurations of a transistor formation region 300D and an LED formation region 400D of the display device 40 according to an embodiment of the present invention.

In the display device 40, a transistor 41 and an LED 42 are provided on the amorphous substrate 500. That is, the transistor 41 is provided in the transistor formation region 300D, and the LED 42 is provided in the LED formation region 400D. The transistor 41 includes a first insulating alignment layer 315, the first p-type semiconductor layer 320, the first n-type semiconductor layer 330, the gate insulating layer 360, the gate electrode layer 362, the source electrode layer 366, and the drain electrode layer. The LED 42 includes a second insulating alignment layer 415, the second p-type semiconductor layer 420, the second n-type semiconductor layer 430, the light emitting layer 460, the n-type electrode layer 462, and the p-type electrode layer 466D. The first insulating alignment layer 315 and the second insulating alignment layer 415 are the same layer formed by patterning a film deposited in the same step. That is, in the display device 40, the first insulating alignment layer 315 and the second insulating alignment layer 415 are provided instead of the first conductive alignment layer 110 and the second conductive alignment layer 210 of the display device 20. In addition, since the first insulating alignment layer 315, the second insulating alignment layer 415, and the p-type electrode layer 464 are the first insulating alignment layer 115, the second insulating alignment layer 215, and the p-type electrode layer 266B of the display device 30, respectively, the description thereof is omitted here.

As described above, in the display device 40, the transistor 41 and the LED 42 are provided directly on the amorphous substrate 500. Each of the transistor 41 and the LED 42 of the display device 40 includes the insulating alignment layer (the first insulating alignment layer 315 or the second insulating alignment layer 415), the first semiconductor layer (the first p-type semiconductor layer 320 or the second p-type semiconductor layer 420), and the second semiconductor layer (the first n-type semiconductor layer 330 or the second n-type semiconductor layer 330). Each of the insulating alignment layer, the first semiconductor layer, and the second semiconductor layer is formed by patterning a film deposited in one step. Therefore, the display device 40 can be manufactured at low cost, and the manufacturing cost of the display device 40 can be suppressed.

Each of the embodiments described above as an embodiment of the present invention can be appropriately combined and implemented as long as they do not contradict each other. Additions, deletions, or design changes of constituent elements, or additions, omissions, or changes to conditions of steps as appropriate based on the respective embodiments are also included within the scope of the present invention as long as the gist of the present invention is provided.

Other effects which differ from those brought about by each of the embodiments described above, but which are apparent from the description herein or which can be readily predicted by those skilled in the art, are naturally understood to be brought about by the present invention.

What is claimed is:

1. A display device comprising:

a transistor on a first region of an amorphous substrate;

an LED on a second region different from the first region of the amorphous substrate;

wherein each of the transistor and the LED comprises:

a conductive alignment layer, a first semiconductor layer over the conductive alignment layer, and a second semiconductor layer over the first semiconductor layer, wherein the conductive alignment layer, the first semiconductor layer, and the second semiconductor layer of the transistor are a same layer as the conductive alignment layer, the first semiconductor layer, and the second semiconductor layer of the LED, respectively, wherein in the transistor, the first semiconductor layer is in contact with the second semiconductor layer, and wherein in the LED, a light emitting layer is provided between the first semiconductor layer and the second semiconductor layer.

2. The display device according to claim 1, wherein the first semiconductor layer comprises a p-type semiconductor, and wherein the second semiconductor layer comprises an n-type semiconductor layer.

3. The display device according to claim 2, wherein a drain electrode is provided on the second semiconductor layer of the transistor, wherein an n-type electrode is provided on the second semiconductor layer of the LED, and wherein the drain electrode is electrically connected to the n-type electrode.

4. The display device according to claim 1, wherein the first semiconductor layer comprises an n-type semiconductor, and wherein the second semiconductor layer comprises a p-type semiconductor layer.

5. The display device according to claim 4, wherein a drain electrode is provided on the second semiconductor layer of the transistor, and wherein the drain electrode is electrically connected to the conductive alignment layer of the LED.

6. The display device according to claim 1, wherein the conductive alignment layer of the transistor is divided into multiple regions.

7. The display device according to claim 1, wherein the first semiconductor layer comprises gallium nitride.

8. The display device according to claim 1, wherein the conductive alignment layer comprises at least one selected from titanium, aluminum, graphene, and zinc oxide.

9. The display device according to claim 1, wherein the amorphous substrate is an amorphous glass substrate.

* * * * *